(12) United States Patent
Kumar et al.

(10) Patent No.: US 12,340,162 B1
(45) Date of Patent: Jun. 24, 2025

(54) SYSTEM AND METHOD FOR ELECTRONIC DESIGN STRUCTURE CONNECTION MANAGEMENT

(71) Applicant: Cadence Design Systems, Inc., San Jose, CA (US)

(72) Inventors: Hitesh Mohan Kumar, Greater Noida (IN); Sahil Vij, Haryana (IN); Anuj Jain, Greater Noida (IN); Deepak Gupta, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 448 days.

(21) Appl. No.: 17/893,357

(22) Filed: Aug. 23, 2022

(51) Int. Cl.
*G06F 30/394* (2020.01)
*G06F 30/31* (2020.01)
*G06F 30/392* (2020.01)

(52) U.S. Cl.
CPC ............ *G06F 30/394* (2020.01); *G06F 30/31* (2020.01); *G06F 30/392* (2020.01)

(58) Field of Classification Search
CPC ...................................................... G06F 30/394
USPC .......................................................... 716/139
See application file for complete search history.

(56) References Cited

U.S. PATENT DOCUMENTS

2009/0217230 A1* 8/2009 He ........................ G06F 30/398
716/129

* cited by examiner

*Primary Examiner* — Eric D Lee
(74) *Attorney, Agent, or Firm* — Mark H . Whittenberger; Holland & Knight LLP

(57) ABSTRACT

Systems and methods for electronic design are provided. Embodiments may include causing a display of an electronic design at a graphical user interface and receiving via the graphical user interface, a user input connecting a first group including one or more scalar nets or buses with a symbolic representation of a second group including one or more scalar nets or buses. The first group and the second group may have an asymmetric structure. Embodiments may include performing an automatic connection assignment between the members of the first group and the second group.

20 Claims, 22 Drawing Sheets

FIG. 6

SYSTEM AND METHOD FOR ELECTRONIC DESIGN STRUCTURE CONNECTION MANAGEMENT

BACKGROUND

The invention relates to technology for designing and verifying an electronic design, such as the design of an integrated circuit (IC). Modern electronic design is typically performed with computer aided design (CAD) tools or electronic design automation (EDA) systems. To design an integrated circuit, a designer first creates high level behavior descriptions of the IC device using a high-level hardware design language (HDL). Common examples of HDLs include Verilog and VHDL. An EDA system typically receives the high level behavioral descriptions of the IC device and translates this high-level design language into netlists of various levels of abstraction. Essentially, the process to implement an electronic device begins with functional design and verification (e.g., using RTL), and then proceeds to physical design and verification.

Circuit designers and verification engineers use different methods to verify circuit designs. One common method of verification is the use of simulation. Simulation dynamically verifies a design by monitoring behaviors of the design with respect to test stimuli. For many types of designs, simulation can and should be performed during the design process to ensure that the ultimate goals are achievable and will be realized by the finished product. The exploding demand for high performance electronic products has increased interest in efficient and accurate simulation techniques for integrated circuits and printed circuit boards (PCBs).

SUMMARY

In one or more embodiments of the present disclosure, a computer-implemented method for electronic design is provided. The method may include causing a display of an electronic design at a graphical user interface and receiving via the graphical user interface, a user input connecting a first group including one or more scalar nets or buses with a symbolic representation of a second group including one or more scalar nets or buses. The first group and the second group may have an asymmetric structure. The method may include performing an automatic connection assignment between the members of the first group and the second group.

One or more of the following features may be included. In some embodiments, the method may include causing a display of a connectivity form at the graphical user interface, wherein the connectivity form allows for verification of the automatic connection. The first group and the second group have a fluid definition wherein a structure or membership of the first and second groups changes throughout an electronic design cycle. The connectivity form may allow a user to override the automatic connection. Upon a design change to a higher level or a lower level of a design hierarchy, the automatic connection assignment may be preserved. The first group and the second group may have a tree-like structure. The first group may include a plurality of groups each including one or more scalar nets or buses.

In one or more embodiments of the present disclosure a computer-readable storage medium having stored thereon instructions, which when executed by a processor result in one or more operations is provided. Operations may include causing a display of an electronic design at a graphical user interface and receiving via the graphical user interface, a user input connecting a first group including one or more scalar nets or buses with a symbolic representation of a second group including one or more scalar nets or buses. The first group and the second group may have an asymmetric structure. Operations may include performing an automatic connection assignment between the members of the first group and the second group.

One or more of the following features may be included. In some embodiments, operations may include causing a display of a connectivity form at the graphical user interface, wherein the connectivity form allows for verification of the automatic connection. The first group and the second group have a fluid definition wherein a structure or membership of the first and second groups changes throughout an electronic design cycle. The connectivity form may allow a user to override the automatic connection. Upon a design change to a higher level or a lower level of a design hierarchy, the automatic connection assignment may be preserved. The first group and the second group may have a tree-like structure. The first group may include a plurality of groups each including one or more scalar nets or buses.

In yet another embodiment of the present disclosure a system for electronic design n is provided. The system may include a processor configured to cause a display of an electronic design at a graphical user interface. The processor may be further configured to receive via the graphical user interface, a user input connecting a first group including one or more scalar nets or buses with a symbolic representation of a second group including one or more scalar nets or buses, wherein the first group and the second group have an asymmetric structure. The processor may be further configured to perform an automatic connection assignment between the members of the first group and the second group.

One or more of the following features may be included. In some embodiments, the processor may be configured to cause a display of a connectivity form at the graphical user interface, wherein the connectivity form allows for verification of the automatic connection. The first group and the second group have a fluid definition wherein a structure or membership of the first and second groups changes throughout an electronic design cycle. The connectivity form may allow a user to override the automatic connection. Upon a design change to a higher level or a lower level of a design hierarchy, the automatic connection assignment may be preserved. The first group and the second group may have a tree-like structure. The first group may include a plurality of groups each including one or more scalar nets or buses.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 6 illustrates a graphical user interface consistent with embodiments of the present disclosure;

DETAILED DESCRIPTION

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of various embodiments, unless otherwise specifically described in particular embodiment(s) or recited in the claim(s). Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-22.

Figure 1:
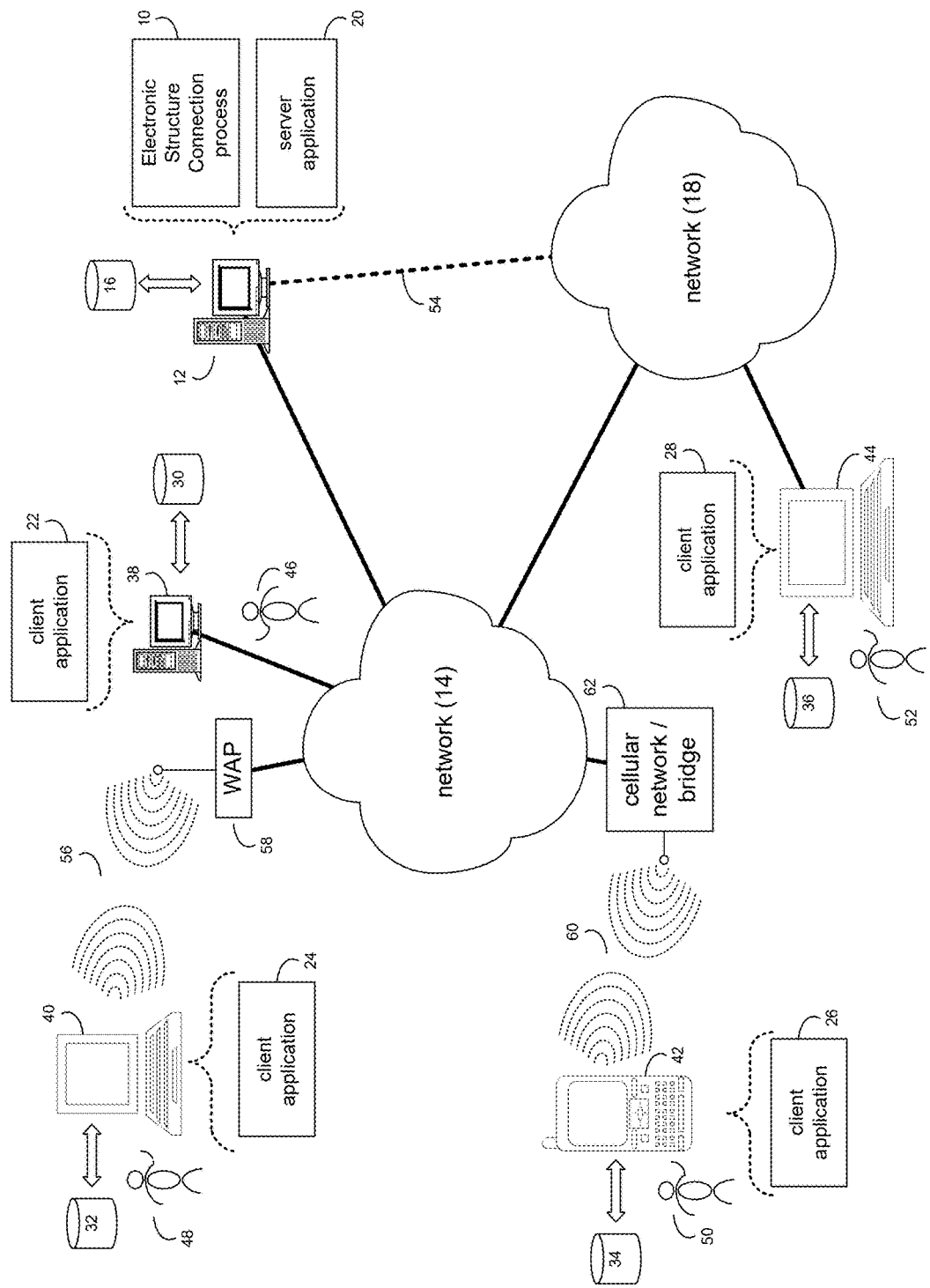
FIG. 1 illustrates a distributed system diagram including an electronic structure connection process consistent with embodiments of the present disclosure.

Referring to FIG. 1, there is shown an electronic structure connection process 10 that may reside on and may be executed by server computer 12, which may be connected to network 14 (e.g., the internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft Windows XP Server™, Novell Netware™, or Redhat Linux™, for example. Additionally and/or alternatively, electronic structure connection process 10 may reside on a client electronic device, such as a personal computer, notebook computer, personal digital assistant, or the like.

The instruction sets and subroutines of electronic structure connection process 10, which may be stored on storage device 16 coupled to server computer 12, may be executed by one or more processors (not shown) and one or more memory architectures (not shown) incorporated into server computer 12. Storage device 16 may include but is not limited to: a hard disk drive; a tape drive; an optical drive; a RAID array; a random access memory (RAM); and a read-only memory (ROM).

Server computer 12 may execute a web server application, examples of which may include but are not limited to: Microsoft IIS™, Novell Webserver™, or Apache Webserver™, that allows for HTTP (i.e., HyperText Transfer Protocol) access to server computer 12 via network 14. Network 14 may be connected to one or more secondary networks (e.g., network 18), examples of which may include but are not limited to: a local area network; a wide area network; or an intranet, for example.

Server computer 12 may execute one or more server applications (e.g., server application 20), examples of which may include but are not limited to, e.g., Lotus Domino™ Server and Microsoft Exchange™ Server. Server application 20 may interact with one or more client applications (e.g., client applications 22, 24, 26, 28) in order to execute Electronic structure connection process 10. Examples of client applications 22, 24, 26, 28 may include, but are not limited to, design verification tools such as those available from the assignee of the present disclosure. These applications may also be executed by server computer 12. In some embodiments, electronic structure connection process 10 may be a stand-alone application that interfaces with server application 20 or may be an applet/application that is executed within server application 20.

The instruction sets and subroutines of server application 20, which may be stored on storage device 16 coupled to server computer 12, may be executed by one or more processors (not shown) and one or more memory architectures (not shown) incorporated into server computer 12.

As mentioned above, in addition/as an alternative to being a server-based application residing on server computer 12, the electronic structure connection process may be a client-side application residing on one or more client electronic devices 38, 40, 42, 44 (e.g., stored on storage devices 30, 32, 34, 36, respectively). As such, the electronic structure connection process may be a stand-alone application that interfaces with a client application (e.g., client applications 22, 24, 26, 28), or may be an applet/application that is executed within a client application. As such, the electronic structure connection process may be a client-side process, a server-side process, or a hybrid client-side/server-side process, which may be executed, in whole or in part, by server computer 12, or one or more of client electronic devices 38, 40, 42, 44.

The instruction sets and subroutines of client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory architectures (not shown) incorporated into client electronic devices 38, 40, 42, 44 (respectively). Storage devices 30, 32, 34, 36 may include but are not limited to: hard disk drives; tape drives; optical drives; RAID arrays; random access memories (RAM); read-only memories (ROM), compact flash (CF) storage devices, secure digital (SD) storage devices, and memory stick storage devices. Examples of client electronic devices 38, 40, 42, 44 may include, but are not limited to, personal computer 38, laptop computer 40, personal digital assistant 42, notebook computer 44, a data-enabled, cellular telephone (not shown), and a dedicated network device (not shown), for example. Using client applications 22, 24, 26, 28, users 46, 48, 50, 52 may utilize formal analysis, testbench simulation, and/or hybrid technology features to verify and/or simulate a particular integrated circuit design.

Users 46, 48, 50, 52 may access server application 20 directly through the device on which the client application (e.g., client applications 22, 24, 26, 28) is executed, namely client electronic devices 38, 40, 42, 44, for example. Users 46, 48, 50, 52 may access server application 20 directly through network 14 or through secondary network 18. Further, server computer 12 (e.g., the computer that executes server application 20) may be connected to network 14 through secondary network 18, as illustrated with phantom link line 54.

In some embodiments, electronic structure connection process 10 may be a cloud-based process as any or all of the operations described herein may occur, in whole, or in part, in the cloud or as part of a cloud-based system. The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 56 established between laptop computer 40 and wireless access point (i.e., WAP) 58, which is shown directly coupled to network 14. WAP 58 may be, for example, an IEEE 802.11a, 802.11b, 802.11g, Wi-Fi, and/or Bluetooth device that is capable of establishing wireless communication channel 56 between laptop computer 40 and WAP 58. Personal digital assistant 42 is shown wirelessly coupled to network 14 via wireless communication channel 60 established between personal digital assistant 42 and cellular network/bridge 62, which is shown directly coupled to network 14.

As is known in the art, all of the IEEE 802.11x specifications may use Ethernet protocol and carrier sense multiple access with collision avoidance (CSMA/CA) for path sharing. The various 802.11x specifications may use phase-shift keying (PSK) modulation or complementary code keying (CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows™, Microsoft Windows CE™, Redhat Linux™, Apple IOS, ANDROID, or a custom operating system.

Figure 2:
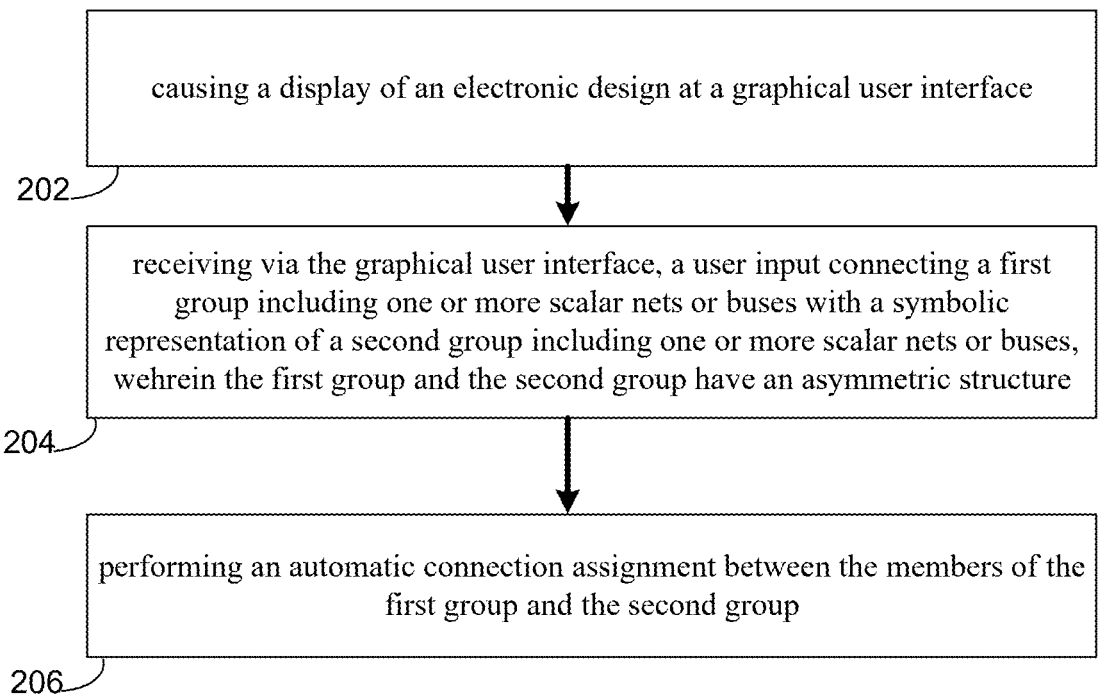
FIG. 2 illustrates a flowchart depicting operations consistent with embodiments of an electronic structure connection process of the present disclosure.

Referring now to FIG. 2, a flowchart depicting an embodiment in accordance with electronic structure connection process 10 is provided. Embodiments may include causing (202) a display of an electronic design at a graphical user interface and receiving (204) via the graphical user interface, a user input connecting a first group including one or more scalar nets or buses with a symbolic representation of a second group including one or more scalar nets or buses. The first group and the second group may have an asymmetric structure. The method may include performing (206) an automatic connection assignment between the members of the first group and the second group. Numerous other operations are also within the scope of the present disclosure as are discussed in further detail hereinbelow.

As used herein, the term "NetGroup" (NG) may refer to a group of scalar nets, buses or other NetGroups. These may have a tree-like structure of any depth. The term "PortGroup" (PG) may refer to a symbolic representation of an interface NetGroup that goes up an electronic design hierarchy. A symmetric membership structure of one NetGroup with respect to another NetGroup is the condition wherein both of the NetGroups have exactly the same set of member names at every level of their respective tree-structures. An asymmetric membership structure of one NetGroup with respect to another NetGroup is the condition wherein there is a mismatch in the name or number of members at one or more levels of the respective tree-structures of two NetGroups.

Membership of a Netgroup is described as a hierarchical containment structure wherein at every level in the structure hierarchy, there are unique scalar, bus or NetGroup members present inside the NetGroup. The structure hierarchy can be any level deep. The fluid membership definition of a NetGroup is the condition wherein the membership inside a NetGroup is dynamic and can change anytime throughout an electronic design cycle, either by adding, deleting, moving, and/or altering any member at any level of the membership structure hierarchy.

Embodiments of the present disclosure address various issues surrounding connection management of NetGroups and PortGroups associated with an electronic design. Accordingly, embodiments of electronic structure connection process 10 may be configured to address situations where both the NetGroup and PortGroup are asymmetric (e.g., having different structures). Embodiments of electronic structure connection process 10 may allow for both the NetGroup and PortGroup to share a fluid definition (e.g., where the structure and membership changes frequently or occasionally during the design cycle). Additionally and/or alternatively, electronic structure connection process 10 may allow for an automatic connection assignment that occurs between their members. In some embodiments, users may be provided with complete control to manually override or assign any connection. Any change that occurs in a higher level or lower level design hierarchy may be configured to preserve all of the connection assignments between the NetGroup and PortGroup. As such, embodiments of electronic structure connection process 10 provide a significant improvement over existing solutions that are very rigid, non-flexible, error prone, manual intensive. Each of these improvements are discussed in further detail hereinbelow.

Figure 3:
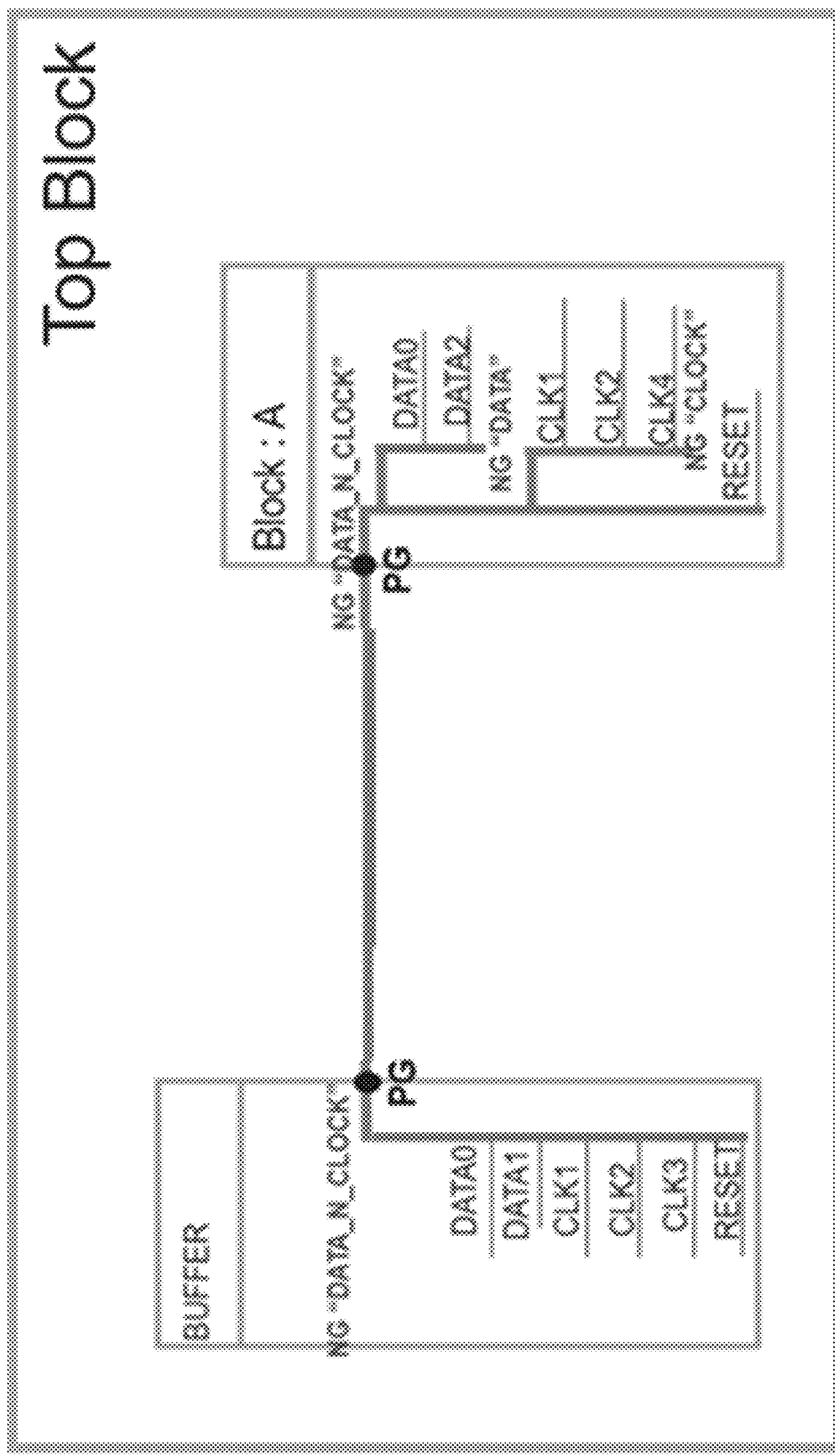
FIGS. 3-5 illustrate diagrams showing NetGroup and PortGroup examples consistent with embodiments of the present disclosure.

Referring now to FIG. 3, a diagram showing an example of NetGroups and PortGroups is provided. In this particular example, one NetGroup (DATA_N_CLOCK) is located within a buffer module which includes six scalar net members (DATA0, DATA1, CLK1, CLK2, CLK3, RESET). This appears as a PortGroup (PG) on the interface of the Buffer module. Another NetGroup (DATA_N_CLOCK) is located within the "Block: A" module which includes two NetGroup members DATA and CLOCK and one scalar member RESET. DATA NetGroup has two scalar net members (DATA0, DATA1) and CLOCK NetGroup has three scalar members (CLK1, CLK2, CLK3). This appears as a PortGroup (PG) on the interface of the Block: A module.

In this particular example, the user may intend to directly connect these two interface PortGroups at the top level (Top Block) using another NetGroup at the Top Block. It should be noted that the membership structure of these three NetGroups are all different.

Existing approaches will restrict this direct connection because the structures and membership are different. The problem becomes more complex when there are buses involved with different widths or if there is complete mismatch of membership hierarchy and names. The issue also becomes much more complex when these structures are dynamically changing and users are allowed to do any kind of modifications (additions/deletions/updates) during the design cycle.

Figure 4:
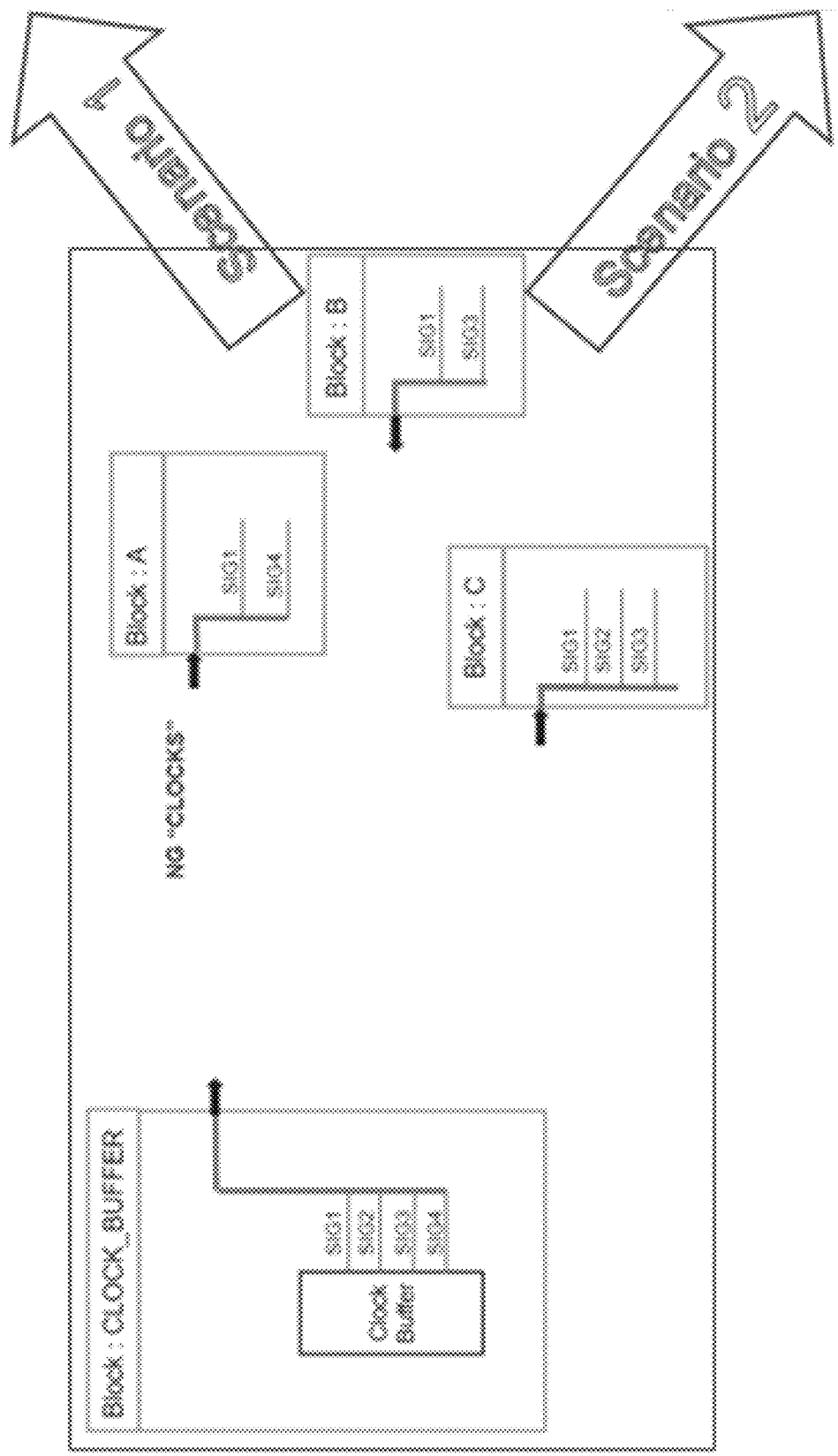
Figure 5:
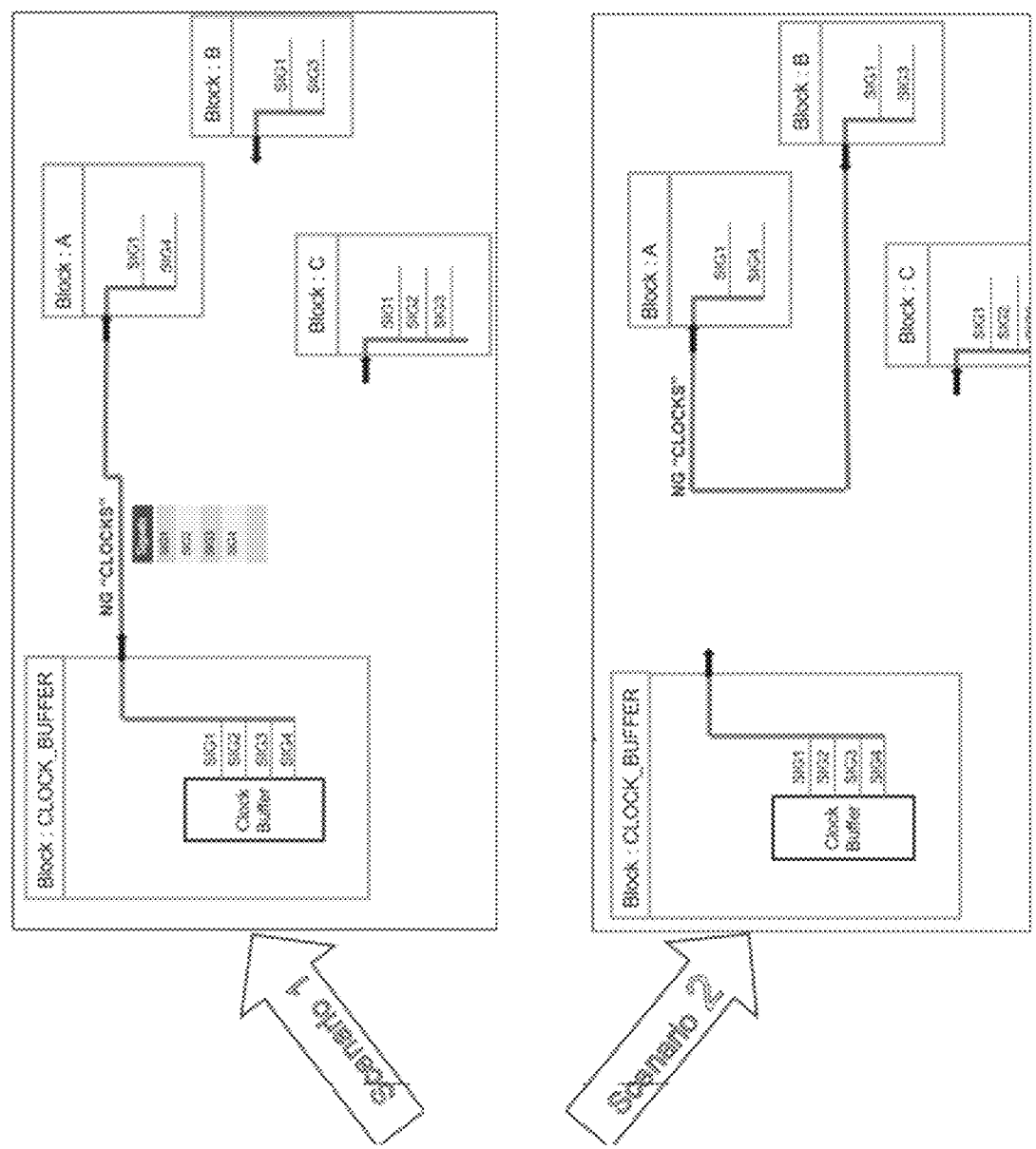

Referring now to FIGS. 4-5, an example of PortGroups and NetGroups showing two distinct scenarios is provided. In the first scenario, the two PortGroups being connected may include having members which are a superset/subset of each-other. The top level NetGroup is new and has no members yet. In this example, the user intends to auto-connect them. In the second scenario, the two PortGroups being connected are not a superset/subset of each-other with respect to their members. The NetGroup is new and has no members yet. In this example, the user intends to auto-connect them primarily but also wants to make some manual connections also.

Figure 6:
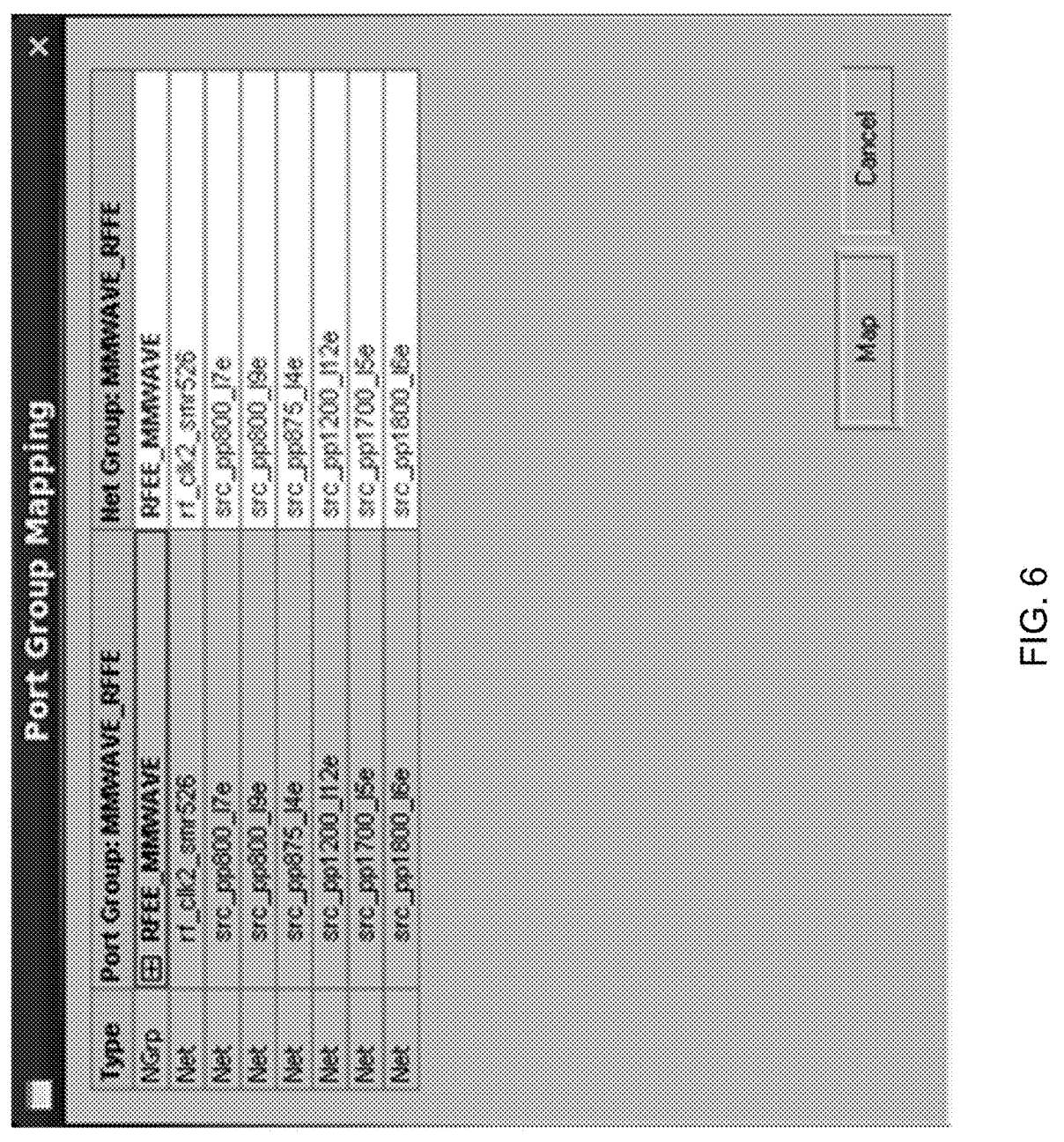

Referring now to FIG. 6, a graphical user interface of an existing solution depicting an example of Port Group mapping is provided. Existing solutions require NetGroup and PortGroup hierarchical structures to be symmetrical or exactly match in order to perform connectivity. Bus members can only be connected with same width bus members and there is no easy way to manage the NetGroup hierarchy structure without losing connectivity. Any changes in the mapping require manually intensive work and unique connectivity cases cannot be achieved.

Figure 7:
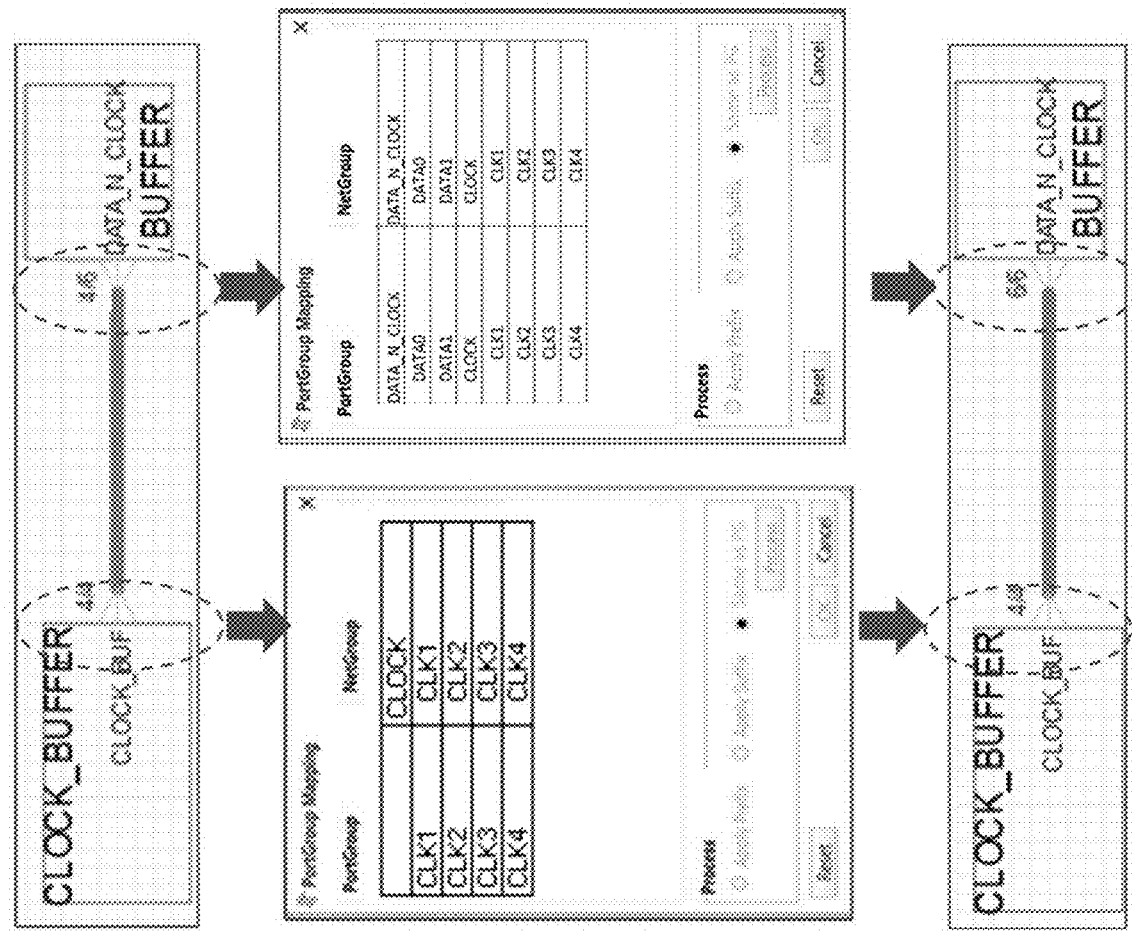
FIG. 7 illustrates a PortGroup graphical user interface consistent with embodiments of the present disclosure.

Referring now to FIG. 7, an example of a PortGroup graphical user interface is provided. Embodiments of electronic structure connection process 10 may allow NetGroup and PortGroup connections for any combination. This may include, but is not limited to, for different count of members in NG and PG, different structure of members in NG and PG, the same count and structure of members in NG and PG, different membership structures on both ends, altogether different membership on both ends, etc.

In some embodiments, electronic structure connection process 10 may perform connection auto-mapping in matching cases. For example, using the exact name match or rule-based match between leaf level members. Embodiments of electronic structure connection process 10 may allow the user to edit connections, at individual members level as well as group/subgroup member level for each PortGroup. The process also allows for any incremental change (e.g., addition, deletion or any modification of existing members) PortGroup without losing connectivity. The process may provide a visual indication of the count of unmapped and total members on each PortGroup. Accordingly, embodiments included herein may be configured to address all unique and possible connectivity combinations.

Figure 8:
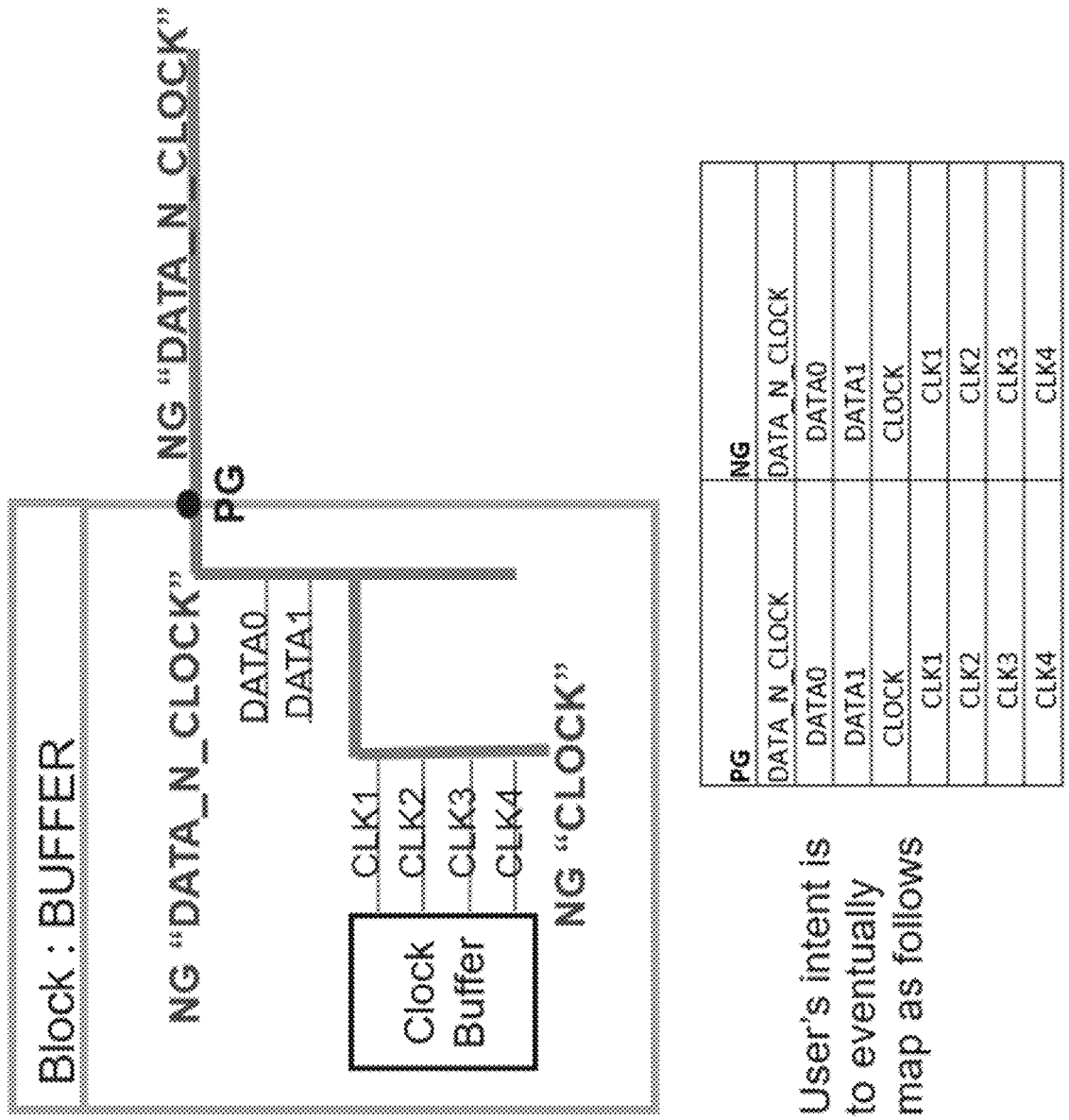
FIGS. 8-9 illustrates an example of NetGroup hierarchy generation consistent with embodiments of the present disclosure.
Figure 9:
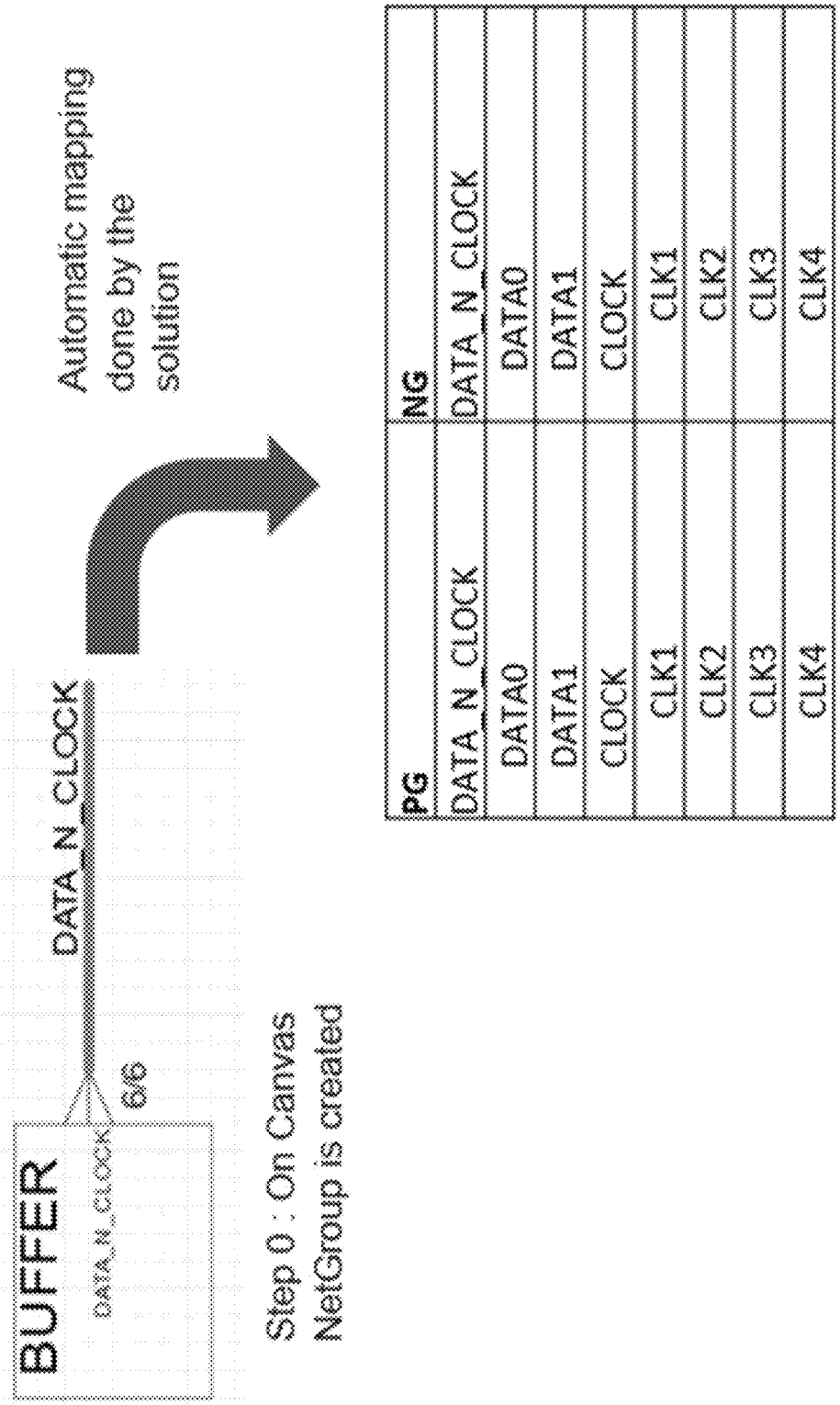

In some embodiments, electronic structure connection process 10 may model the NetGroup connections and NetGroup membership structure independent of each other. This makes it possible to alter connections or alter structures and membership without impacting each-other. Electronic structure connection process 10 may also model the vector members of a NetGroup as individual bit members, thus allowing different widths of the vectors to be connected to each other. Electronic structure connection process 10 may incorporate one or more algorithms for NetGroup membership auto-generation derived from its connection as shown in FIGS. 8-9.

Figure 10:
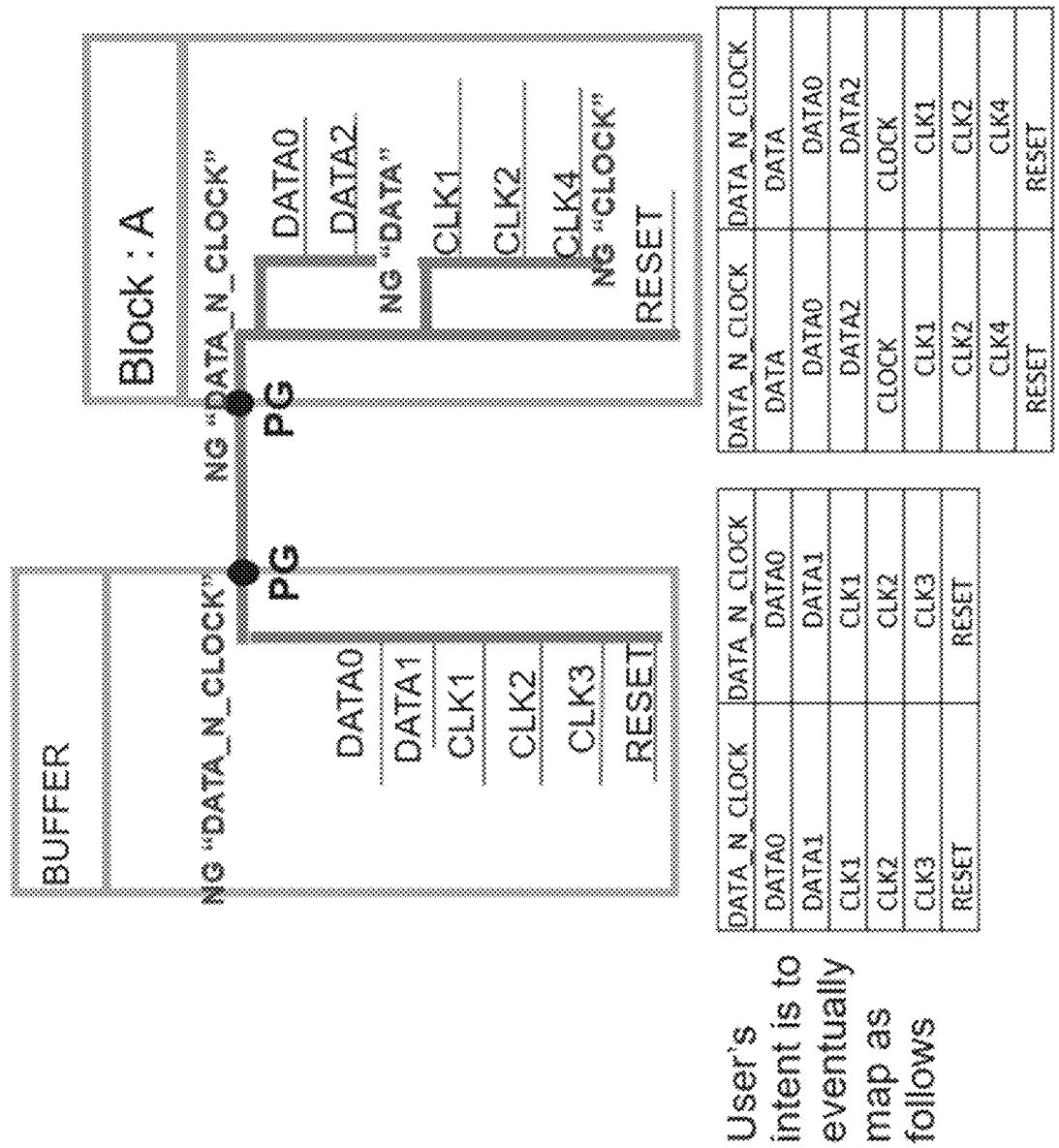
FIGS. 10-11 illustrates an example showing asymmetric structure connection consistent with embodiments of the present disclosure.
Figure 11:
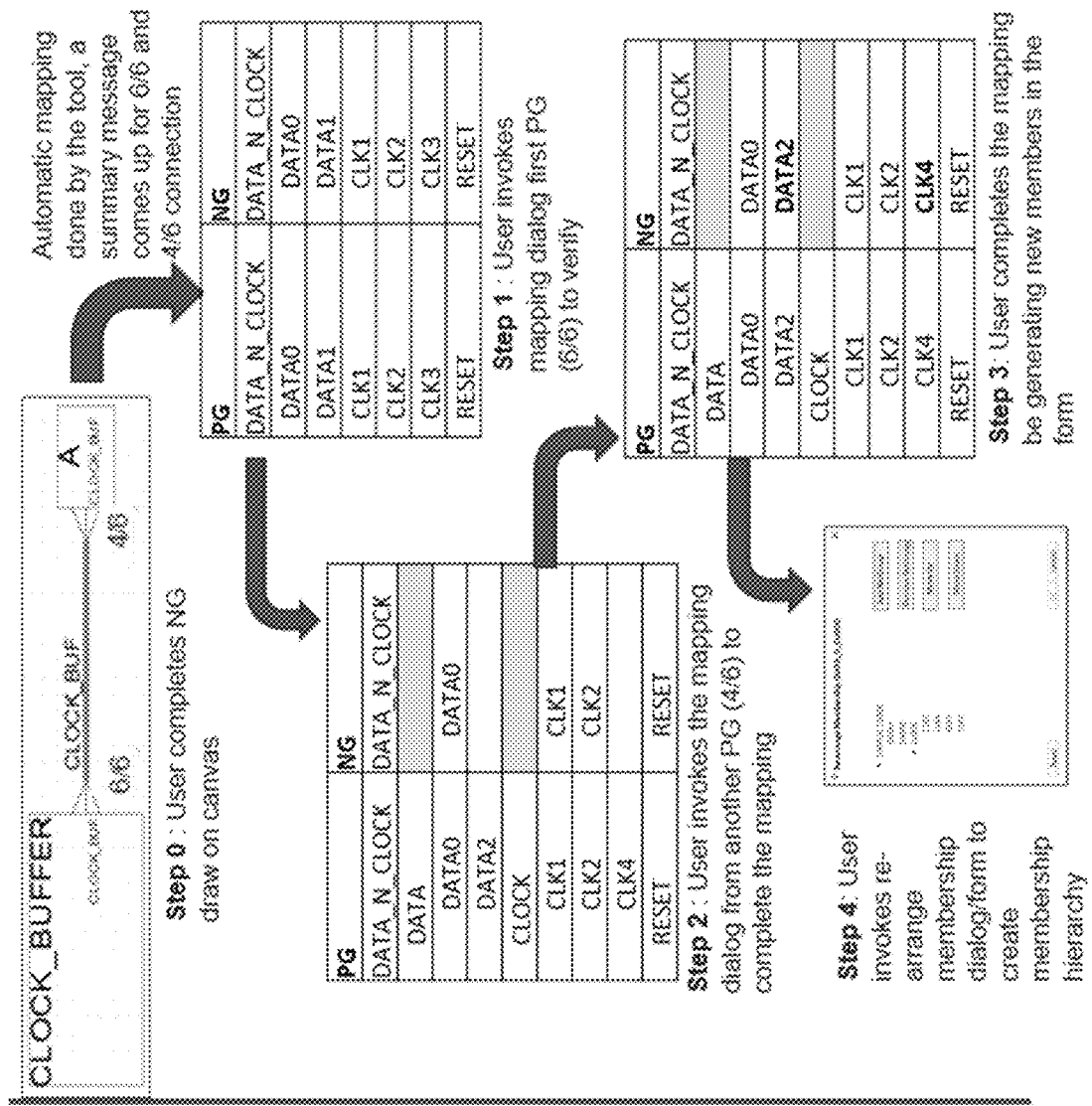
Figure 12:
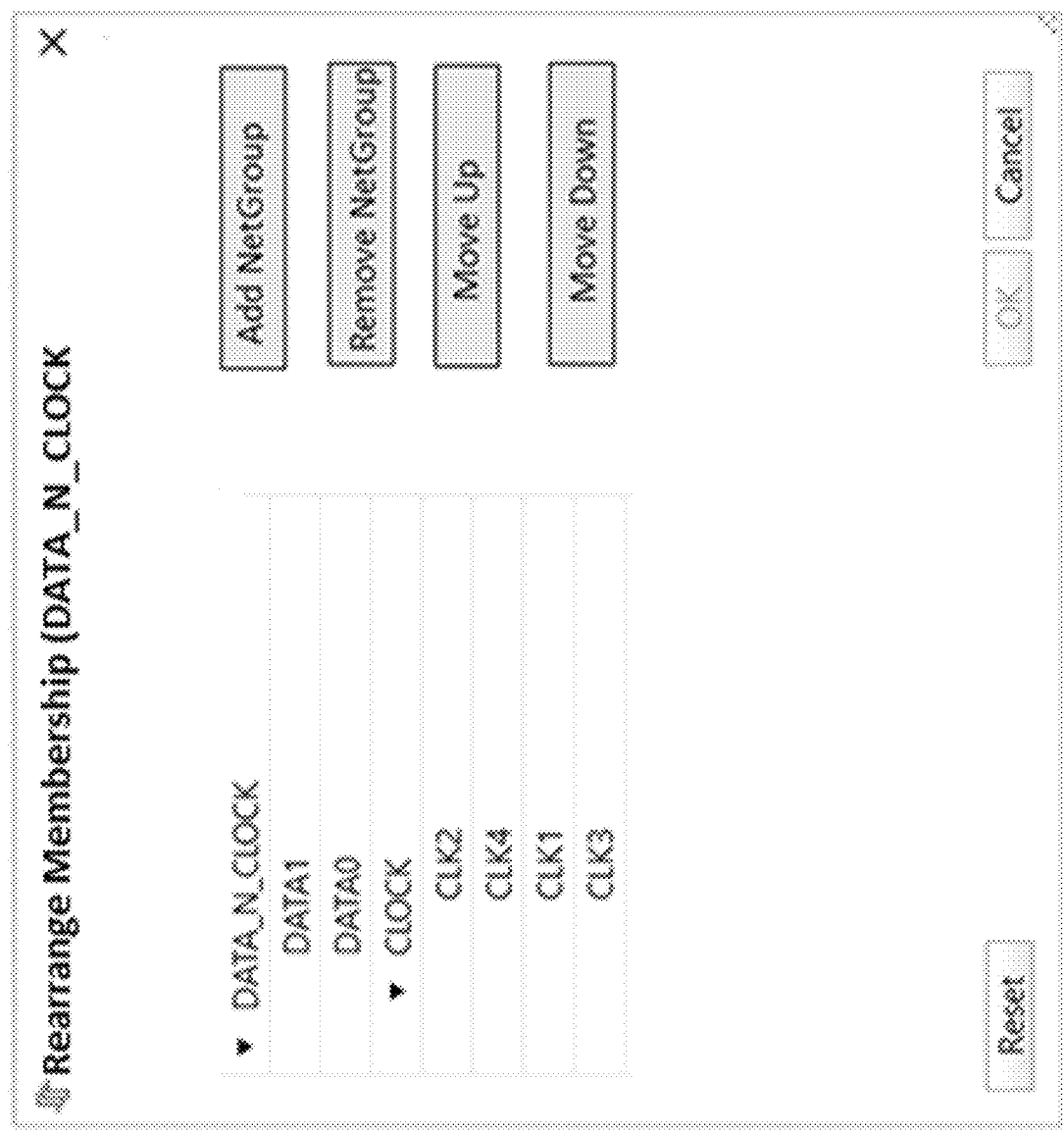
FIGS. 12-13 illustrate graphical user interfaces consistent with embodiments of the present disclosure.
Figure 13:
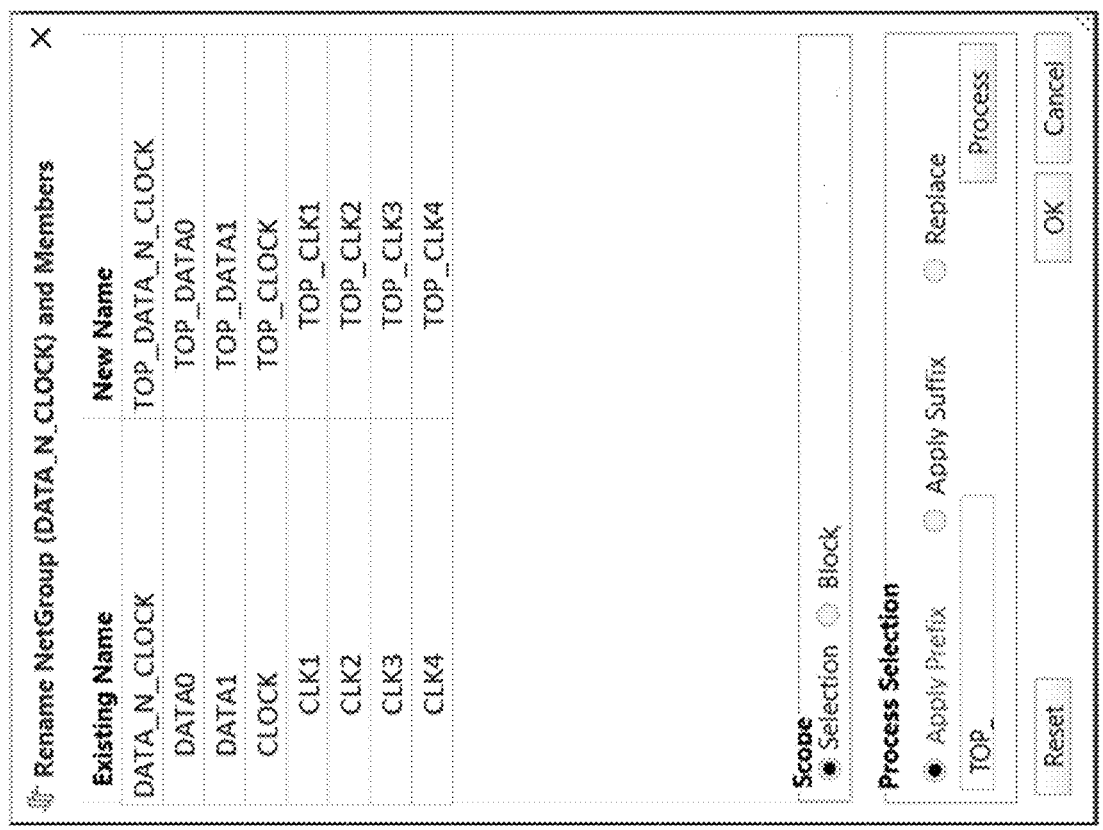

In some embodiments, electronic structure connection process 10 may incorporate one or more algorithms for NetGroup membership auto-connection with the PortGroup members using name match or using configurable rules as shown in FIGS. 10-11. The process may keep track of all changes through unique identifiers so that any membership change or connection change is uniquely identified and change propagation happens without any loss of connectivity at any level as shown in FIGS. 12-13. The process may also allow the user to make membership or connection modifications at top level, at any intermediate levels or at the lowest level of the structural hierarchy.

In some embodiments, electronic structure connection process 10 may model the data in a lossless format. For example, at no point in the electronic design cycle is any connectivity information, any membership information, or any membership structure information lost.

As discussed above, and referring again to FIGS. 8-9, an example of automatic NetGroup hierarchy generation and connection to PortGroups is provided. A table indicating the user's intent is provided in FIG. 8. FIG. 9 shows a NetGroup being created on a canvas. The user may then invoke a mapping dialog from the PortGroup on the canvas. The form shows auto-mapped values upon invocation. The user may then verify this information. If the user wants to rename all the members with a suffix/prefix, they will have an option on the NetGroup on the canvas.

Referring again to FIGS. 10-11 an example showing asymmetric structure connection is provided. In operation, the user may complete the drawing of a NetGroup on the canvas. electronic structure connection process 10 may then be automatically map and a summary message may be displayed for the 6/6 and 4/6 connection. The user may be provided with an option to invoke a mapping dialog first PG (6/6) to verify. The user may then invoke the mapping dialog from another PG (4/6) to complete the mapping. The user may complete the mapping by generating new members in the form and then invokes a re-arrange membership dialog/form to create membership hierarchy.

Referring now to FIG. 12, a graphical user interface depicting an example of fluid NetGroup membership management is provided. In this example, a rearrange membership dialog allows the user to change the NetGroup hierarchal structure, thus maintaining the design integrity. This may include the ability to add/remove hierarchy level, move members across hierarchy levels, etc. The electronic structure connection process 10 described herein ensures that all the connections remain intact upon definition change.

Referring now to FIG. 13, a graphical user interface depicting an example for modifying/renaming NetGroups and members is provided. In this example, electronic structure connection process 10 may provide for the renaming of higher level NetGroups and some or all of its members. Additionally and/or alternatively, the process may allow for the renaming of an individual NetGroup instance, all instances, any/all of its members, etc. The electronic structure connection process 10 described herein ensures that all the connections remain intact upon modification/rename.

Figure 14:
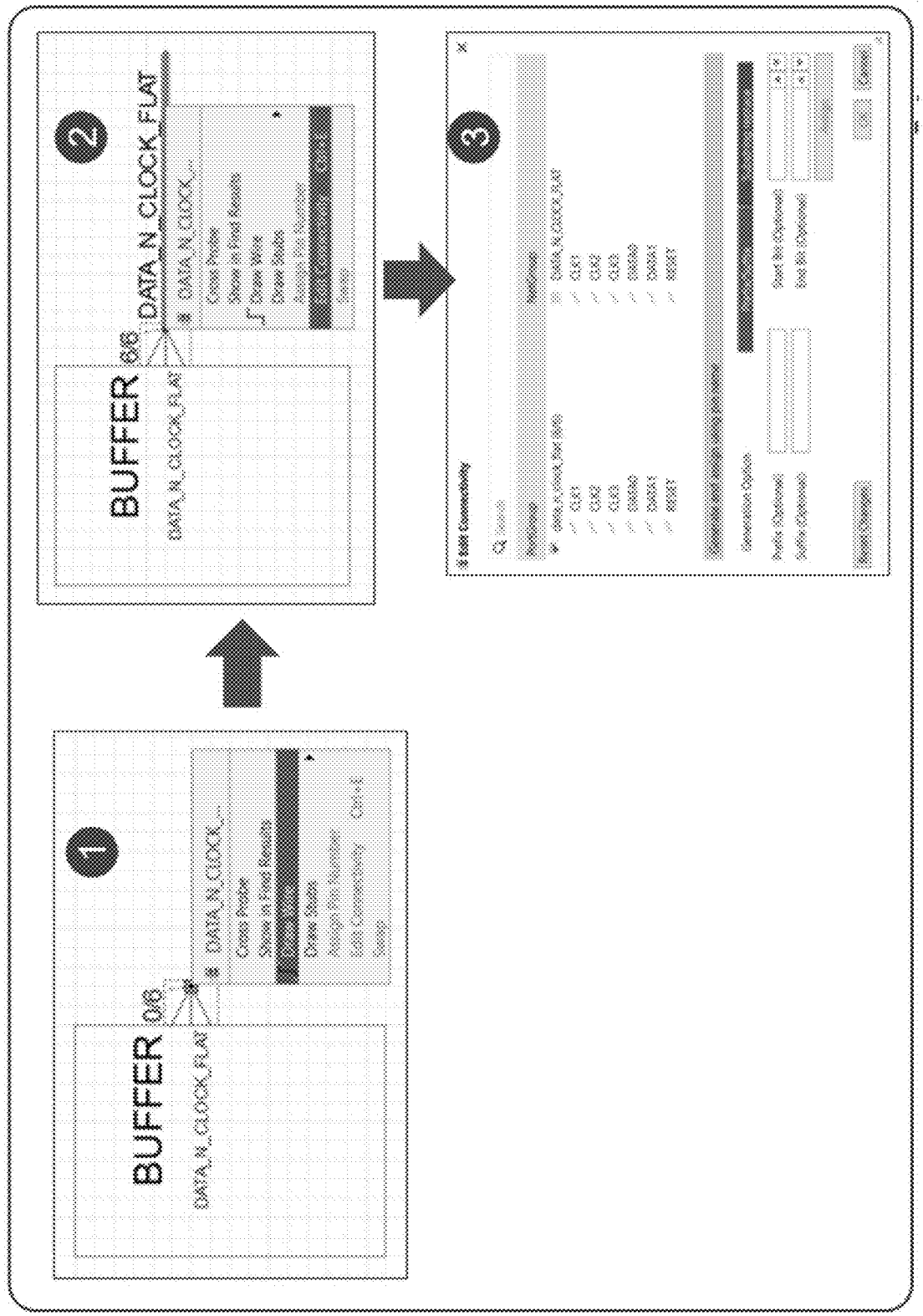
FIGS. 14-21 illustrate examples of graphical user interfaces depicting use cases consistent with embodiments of the present disclosure.

Referring now to FIG. 14-21, graphical user interfaces depicting example use cases consistent with electronic structure connection process 10 are provided. FIG. 14 shows an example for connecting PortGroups to NetGroups with automatic connectivity. In operation, a user may draw a NetGroup from a PortGroup. Electronic structure connection process 10 may then perform the automatic connectivity analysis described herein. The user may then invoke the connectivity form and verify the accuracy of the automatic connectivity.

Figure 15:
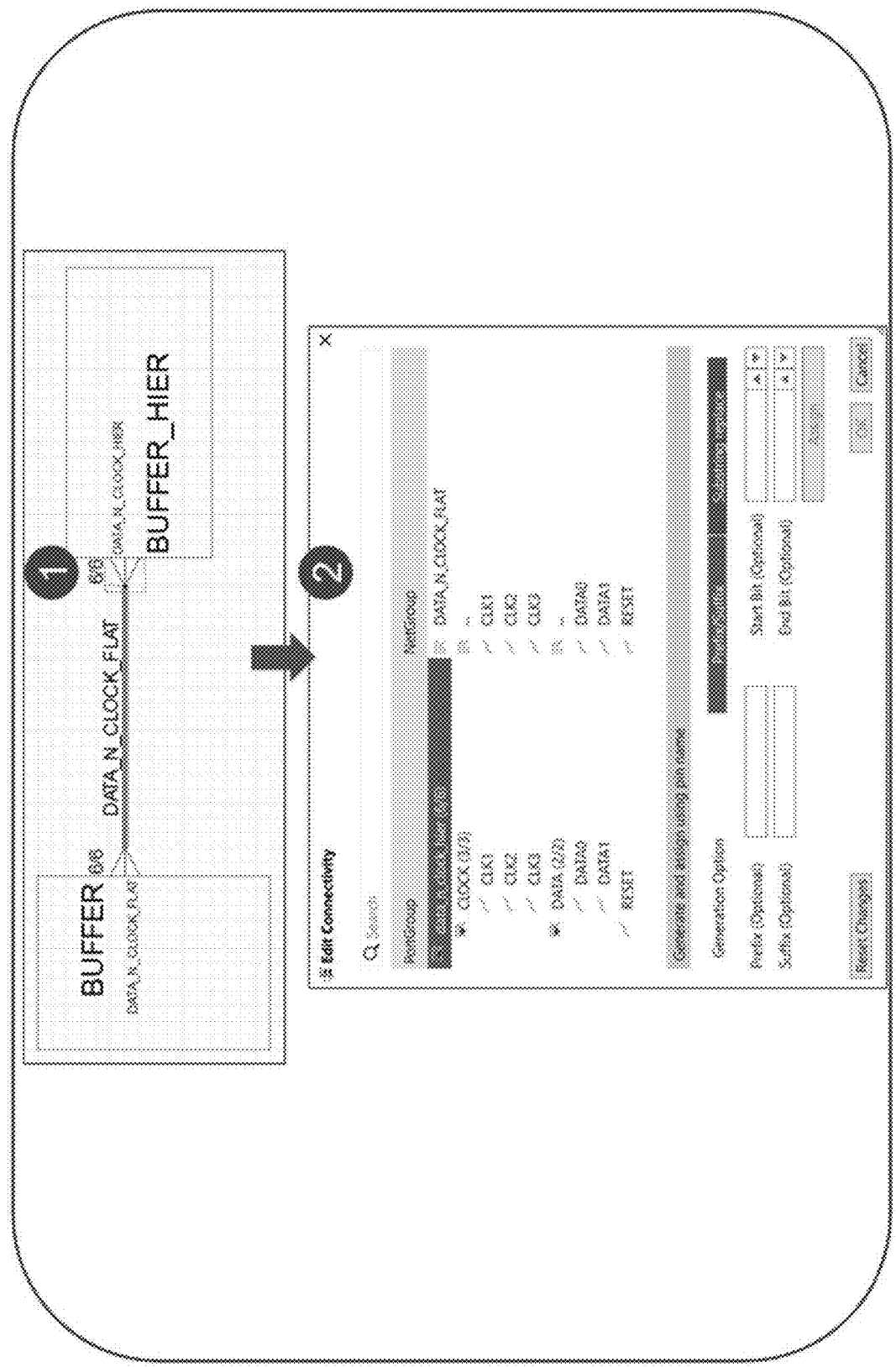

FIG. 15 shows an example for connectivity with an asymmetric hierarchy, which may also utilize an automatic connectivity approach. In operation, the user may draw a NetGroup to connect a second PortGroup that may have an asymmetric structure. The auto-connectivity may be generated. The user may then invoke the connectivity form and verify the accuracy of the automatic connectivity.

Figure 16:
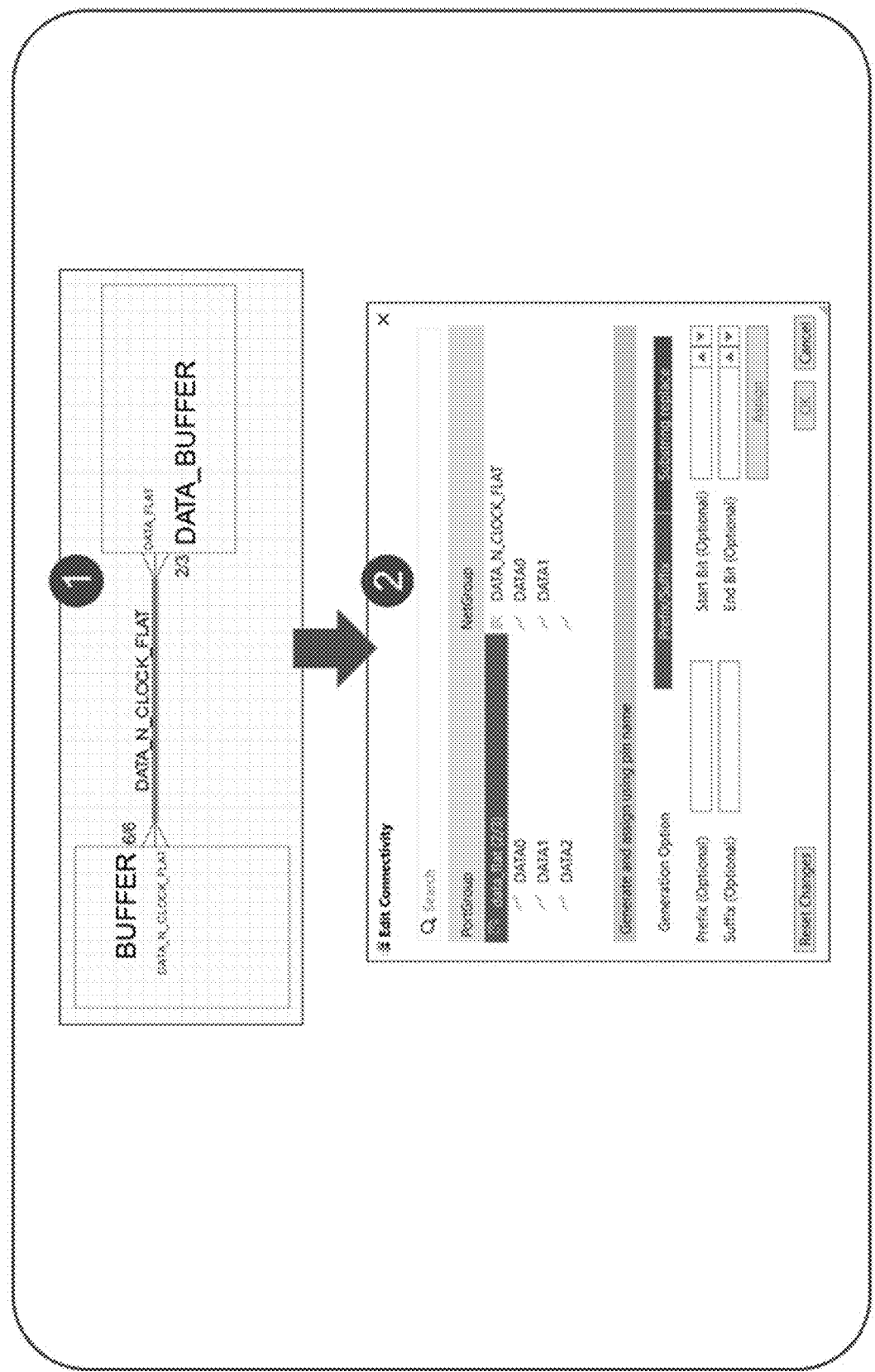

FIG. 16 shows an example for connectivity with PortGroups having a difference in width (member count), which may also utilize an automatic connectivity approach. In operation, the user may draw a NetGroup to connect PortGroups that may have a different width (member count). The auto-connectivity may be generated for matching members and other members may remain unconnected. The user may then invoke the connectivity form and verify the accuracy of the automatic connectivity.

Figure 17:
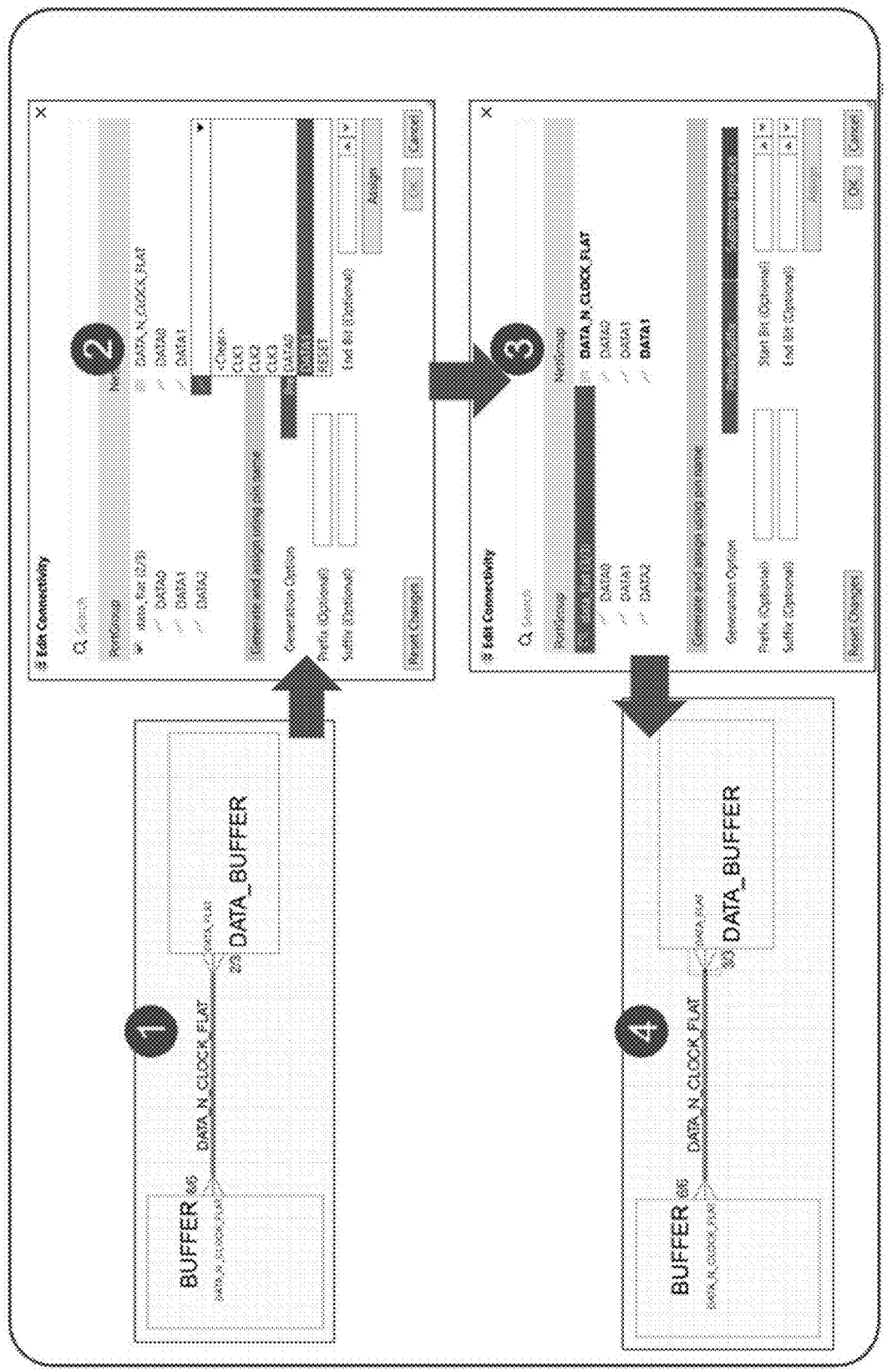

FIG. 17 shows an example showing edit connectivity where manual assignment using existing members may occur. In operation, the user may have incomplete connectivity for PortGroup 'DATA_FLAT'. The user may then invoke the connectivity form and select from the existing NetGroup members from the list to connect to a PortGroup member. Connectivity may be created for the unconnected PortGroup member and the PortGroup may be completely connected.

Figure 18:
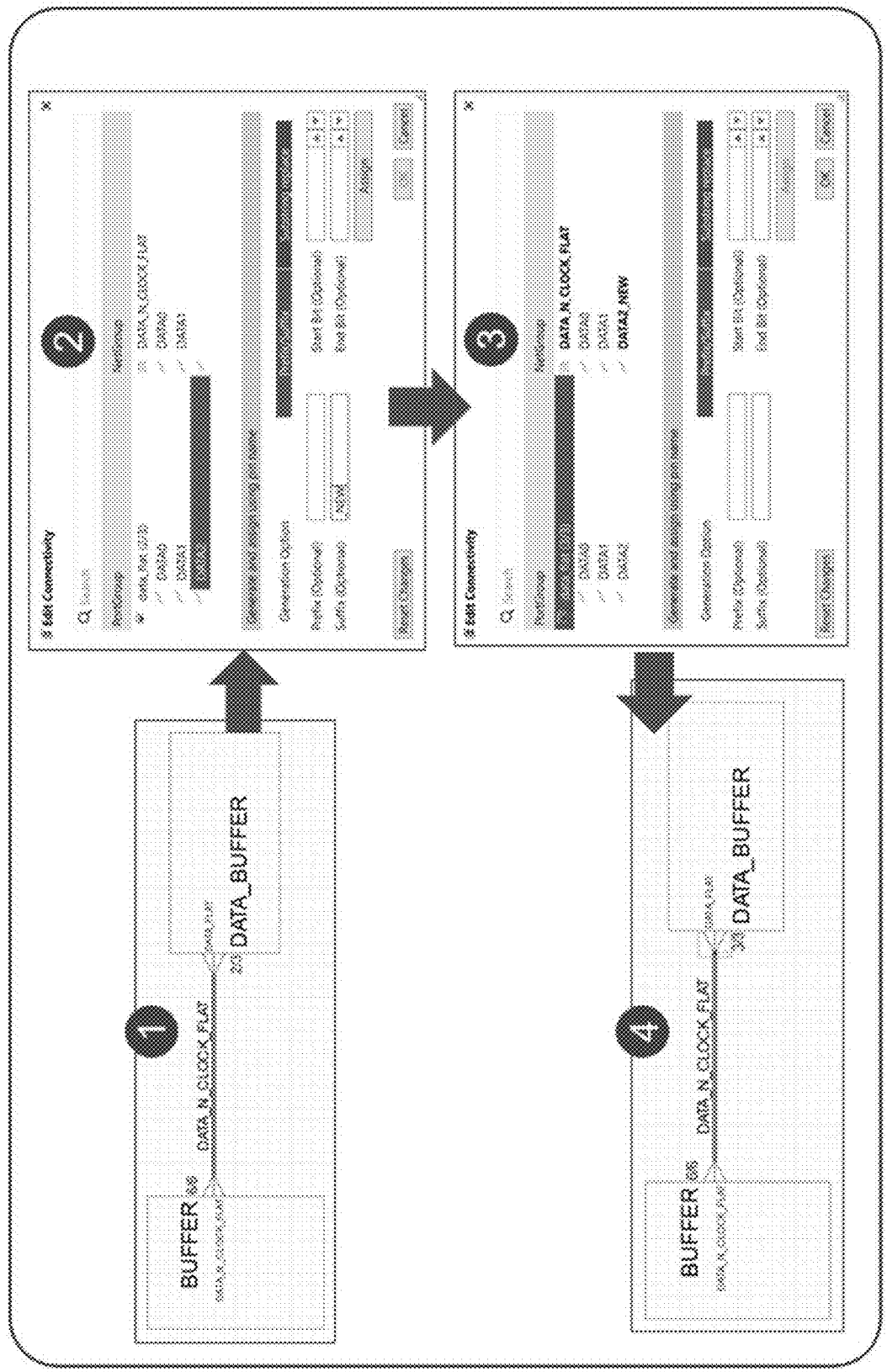

FIG. 18 shows an example showing edit connectivity where manual assignment by creating new NetGroup members using a pin name is provided. In operation, the user may have incomplete connectivity for PortGroup 'DATA_FLAT'. The user may then invoke the connectivity form and generate a net name by adding a suffix and selecting the "assign" button. Connectivity may be created for the unconnected PortGroup member and the PortGroup may be completely connected.

Figure 19:
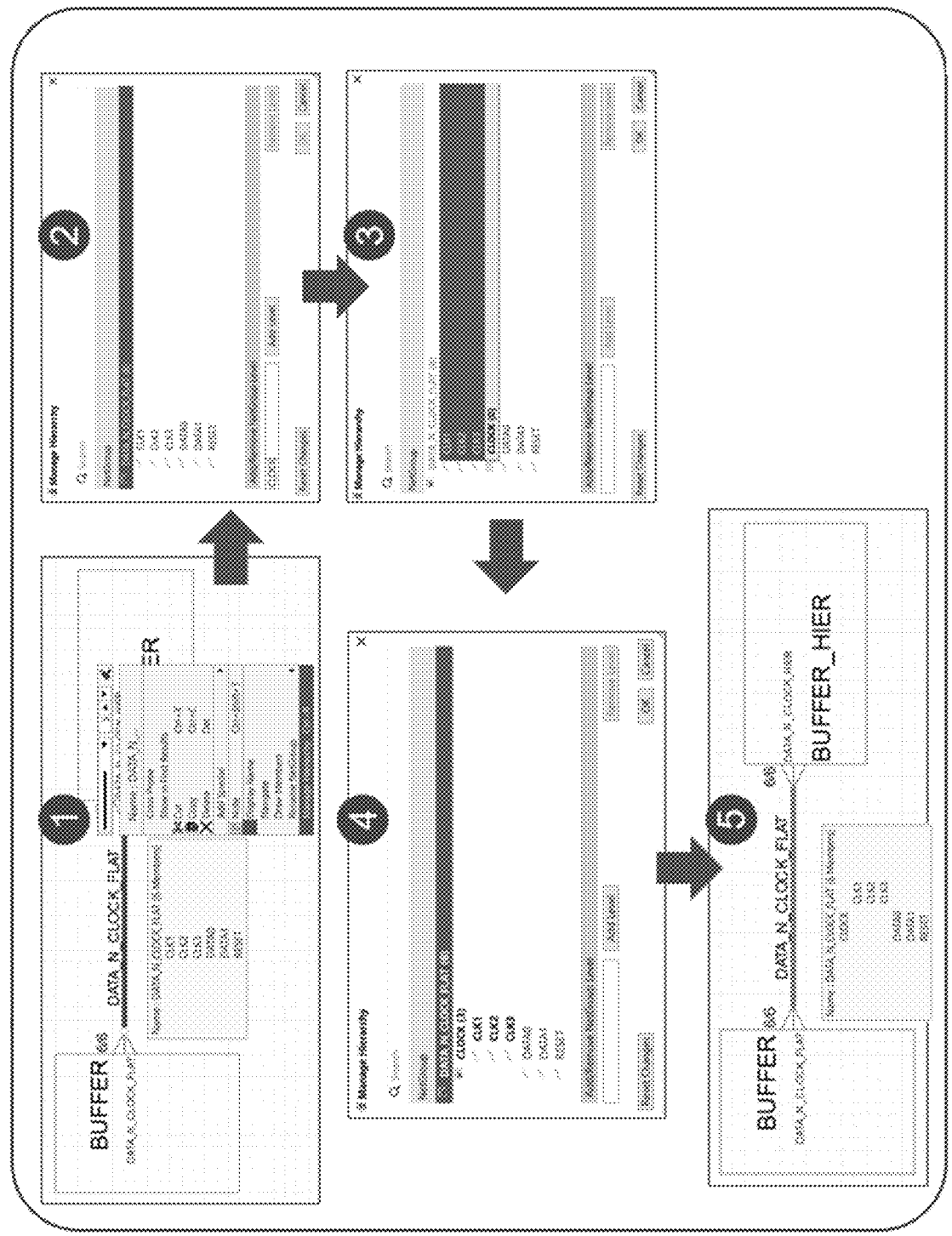

FIG. 19 shows an example for managing NetGroup hierarchy. In operation, the user may have a flat structure for the NetGroup 'DATA_N_CLOCK_FLAT'. The user may invoke the manage hierarchy form. The user may then add a 'CLOCK' NetGroup level under 'DATA_N_CLOCK_FLAT' NetGroup. The user may then select three members and move them under 'CLOCK'. The hierarchy may then be updated in the connectivity form. The user may confirm at the form. The result is an updated NetGroup hierarchy with all connections intact.

Figure 20:
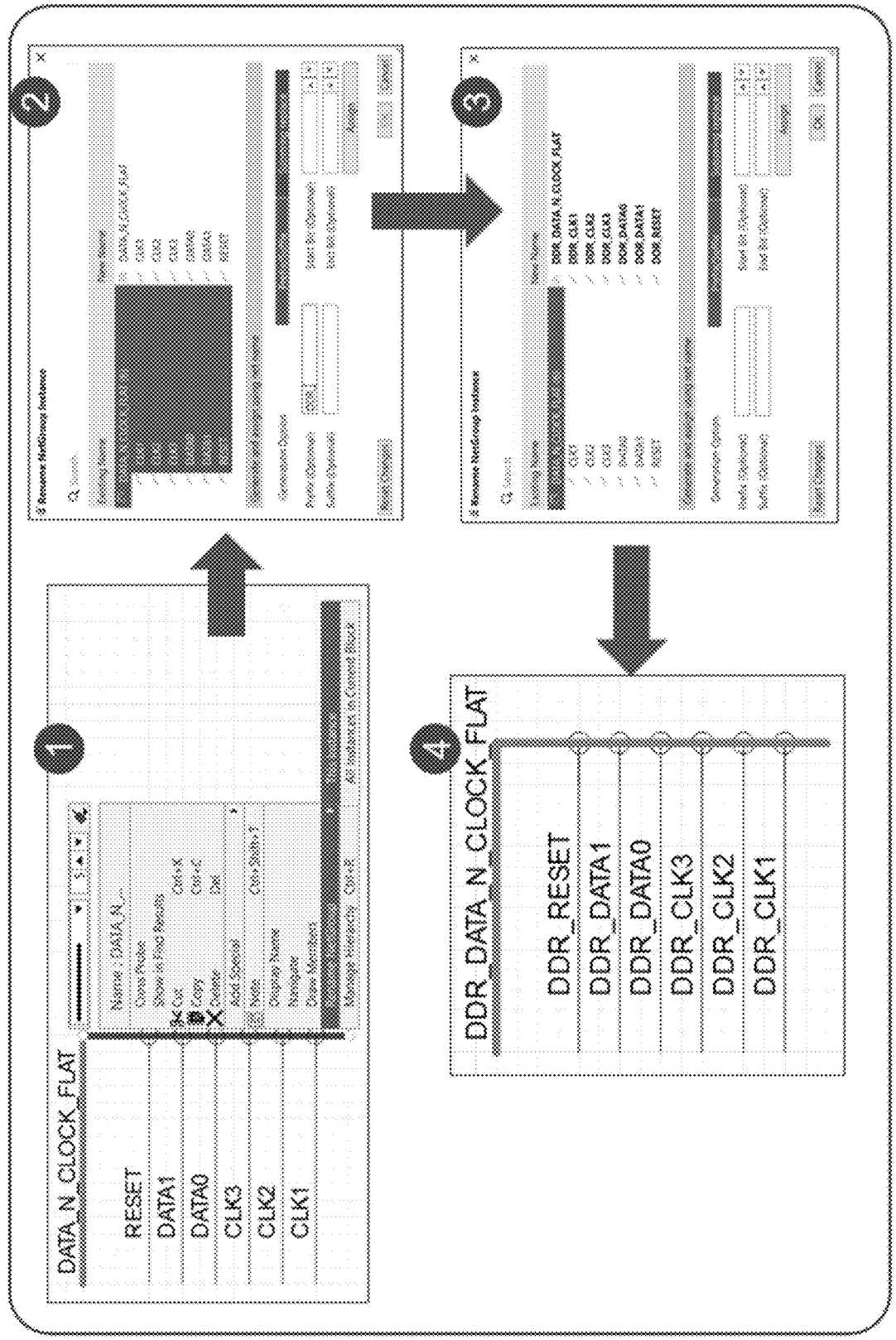

FIG. 20 shows an example for renaming a NetGroup. In operation, the user may invoke a rename NetGroup instance form. The user may generate a new name by adding a prefix and selecting the "assign" button. New names may be assigned for each row with no error. The user may confirm at the form. The NetGroup may be renamed successfully along with members with all connectivity intact.

Figure 21:
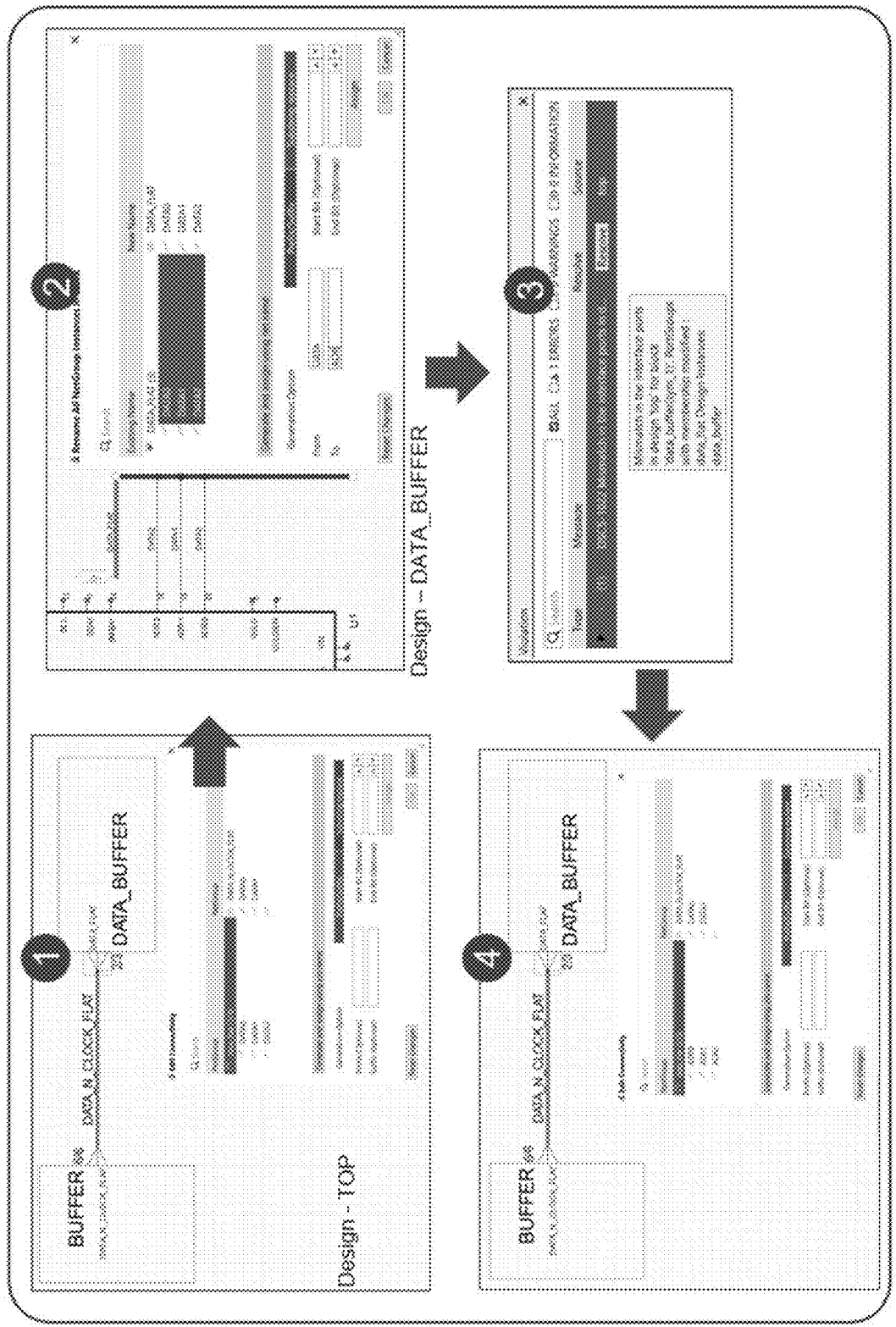

FIG. 21 shows an example for Electronic Change Order (ECO) management. ECO in context of NetGroups and PortGroups is described as the process of incorporating incremental changes in the design and resolving the differences at higher design hierarchy levels to take care of any new additions, deletions or modifications done on the Net-Groups and PortGroups at the lower design hierarchy level. In operation, the user may have DATA0 and DATA1 members in 'DATA_FLAT' PortGroup connected to members of the NetGroup 'DATA_N_CLOCK_FLAT' in 'TOP' design. The user may rename NetGroup members in the design 'DATA BUFFER' (lower level design) using a substring replace option. The user may receive a violation to resolve for 'DATA BUFFER' block instance in the 'TOP' design. After resolution, the PortGroup members may be renamed and the connectivity in the design 'TOP' may remain intact.

Embodiments of electronic structure connection process 10 provide numerous advantages over existing approaches. Some of these include, but are not limited to, symmetric structure management, automatic and manual connection, fluid and on-the-fly definition management without loss of connectivity, intelligent change management (e.g., addition, deletion, modification, rename etc. at different hierarchy levels preserve connection), membership order independence, membership count agnostic, etc.

Figure 22:
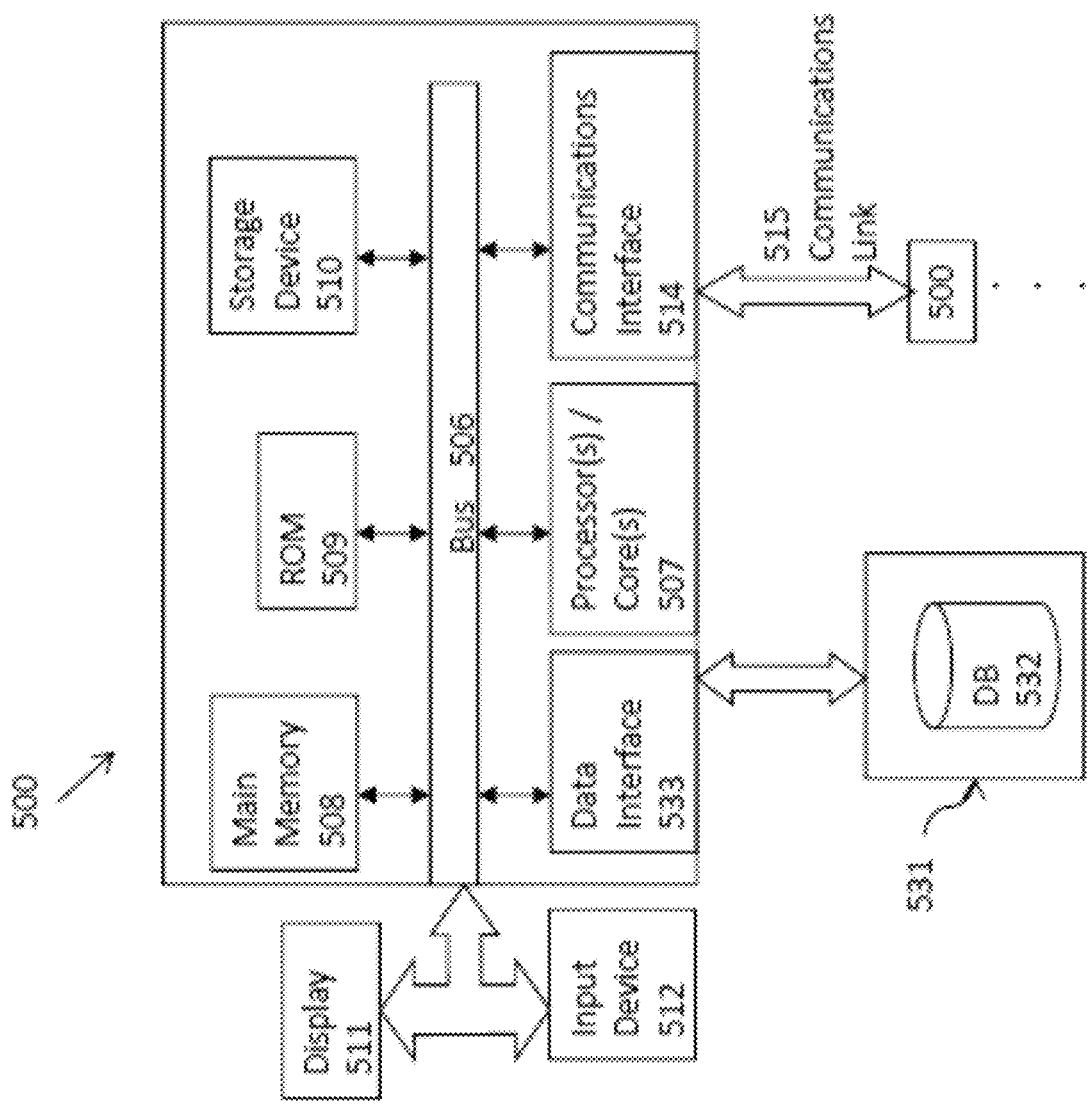
FIG. 22 illustrates a system diagram that may be used to implement one or more embodiments.

FIG. 22 illustrates a block diagram of an illustrative computing system 500 suitable for parasitic extraction as described in the preceding paragraphs with reference to various figures. Computer system 500 includes a bus 506 or other communication mechanism for communicating information, which interconnects subsystems and devices, such as processor 507, system memory 508 (e.g., RAM), static storage device 509 (e.g., ROM), disk drive 510 (e.g., magnetic or optical), communication interface 514 (e.g., modem or Ethernet card), display 511 (e.g., CRT or LCD), input device 512 (e.g., keyboard), and cursor control (not shown).

According to one embodiment, computing system 500 performs specific operations by one or more processor or processor cores 507 executing one or more sequences of one or more instructions contained in system memory 508. Such instructions may be read into system memory 508 from another computer readable/usable storage medium, such as static storage device 509 or disk drive 510. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 507, where the one or more processors, one or more processor cores, or combination thereof executes one or more threads. For example, various acts of identifying, various acts of determining, various acts of classifying, various acts of implementing, various acts of performing, various acts of transforming, various acts of decomposing, various acts of updating, various acts of presenting, various acts of modifying, etc. may be performed by one or more processors, one or more processor cores, or combination thereof.

A mechanism described herein may also be implemented as a pure hardware module (e.g., a block of electronic circuit components, electrical circuitry, etc.) or a combination of a hardware module and a software block that jointly perform various tasks to achieve various functions or purposes described herein or equivalents thereof. For example, a mechanism described herein may be implemented as an application-specific integrated circuit (ASIC) in some embodiments.

In these embodiments, a mechanism may thus include, for example, a microprocessor or a processor core and other supportive electrical circuitry to perform specific functions which may be coded as software or hard coded as a part of an application-specific integrated circuit, ROM (read only memory), PROM (programmable read only memory), EPROM (erasable programmable read only memory), etc. despite the fact that these microprocessor, processor core, and electrical circuitry may nevertheless be shared among a plurality of mechanism. A mechanism described herein or an equivalent thereof may perform its respective functions alone or in conjunction with one or more other mechanisms. A mechanism described herein or an equivalent thereof may thus invoke one or more other mechanisms by, for example, issuing one or more commands or function calls. The invocation of one or more other mechanisms may be fully automated or may involve one or more user inputs.

The term "computer readable storage medium" or "computer usable storage medium" as used herein refers to any non-transitory medium that participates in providing instructions to processor 507 for execution. Such a medium may take many forms, including but not limited to, non-volatile media and volatile media. Non-volatile media includes, for example, optical or magnetic disks, such as disk drive 510. Volatile media includes dynamic memory, such as system memory 508. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 500. According to other embodiments of the invention, two or more computer systems 500 coupled by communication link 515 (e.g., LAN, PTSN, or wireless network) may perform the sequence of instructions required to practice the invention in coordination with one another.

Computer system 500 may transmit and receive messages, data, and instructions, including program, e.g., application code, through communication link 515 and communication interface 514. Received program code may be executed by processor 507 as it is received, and/or stored in disk drive 510, or other non-volatile storage for later execution. In an embodiment, the computing system 500 operates in conjunction with a data storage system 531, e.g., a data storage system 531 that includes a database 532 that is readily accessible by the computing system 500. The computing system 500 communicates with the data storage system 531 through a data interface 533. A data interface 533, which is coupled with the bus 506, transmits and receives electrical, electromagnetic or optical signals that include data streams representing various types of signal information, e.g., instructions, messages and data. In embodiments of the invention, the functions of the data interface 533 may be performed by the communication interface 514. It also should be appreciated that the computer system 500 may be extended to a cloud-based computing system.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer-implemented method comprising:
   causing a display of an electronic design at a graphical user interface;
   receiving via the graphical user interface, a user input connecting a first group including one or more scalar nets or buses with a symbolic representation of a second group including one or more scalar nets or buses, wherein the first group and the second group have an asymmetric structure and wherein at least one of the first group and the second group have a hierarchical structure; and
   performing an automatic connection assignment between the members of the first group and the second group.

2. The computer-implemented method of claim 1, further comprising:
   causing a display of a connectivity form at the graphical user interface, wherein the connectivity form allows for verification of the automatic connection.

3. The computer-implemented method of claim 2, wherein the connectivity form allows a user to override the automatic connection.

4. The computer-implemented method of claim 1, wherein the first group and the second group have a fluid definition wherein a structure or membership of the first and second groups changes throughout an electronic design cycle.

5. The computer-implemented method of claim 1, wherein upon a design change to a higher level or a lower level of a design hierarchy, the automatic connection assignment is preserved.

6. The computer-implemented method of claim 1, wherein the first group and the second group has a tree-like structure.

7. The computer-implemented method claim 1, wherein the first group includes a plurality of groups each including one or more scalar nets or buses.

8. A non-transitory computer-readable storage medium having stored thereon instructions that when executed by a machine result in the following operations:
   causing a display of an electronic design at a graphical user interface;
   receiving via the graphical user interface, a user input connecting a first group including one or more scalar nets or buses with a symbolic representation of a second group including one or more scalar nets or buses, wherein the first group and the second group have an asymmetric structure and wherein at least one of the first group and the second group have a hierarchical structure; and
   performing an automatic connection assignment between the members of the first group and the second group.

9. The non-transitory computer-readable storage medium of claim 8, further comprising:
   causing a display of a connectivity form at the graphical user interface, wherein the connectivity form allows for verification of the automatic connection.

10. The non-transitory computer-readable storage medium of claim 9, wherein the connectivity form allows a user to override the automatic connection.

11. The non-transitory computer-readable storage medium of claim 8, wherein the first group and the second group have a fluid definition wherein a structure or membership of the first and second groups changes throughout an electronic design cycle.

12. The non-transitory computer-readable storage medium of claim 8, wherein upon a design change to a higher level or a lower level of a design hierarchy, the automatic connection assignment is preserved.

13. The non-transitory computer-readable storage medium of claim 8, wherein the first group and the second group has a tree-like structure.

14. The non-transitory computer-readable storage medium of claim 8, wherein the first group includes a plurality of groups each including one or more scalar nets or buses.

15. A system for electronic design comprising:
a processor configured to cause a display of an electronic design at a graphical user interface, the processor further configured to receive via the graphical user interface, a user input connecting a first group including one or more scalar nets or buses with a symbolic representation of a second group including one or more scalar nets or buses, wherein the first group and the second group have an asymmetric structure and wherein at least one of the first group and the second group have a hierarchical structure, the processor further configured to perform an automatic connection assignment between the members of the first group and the second group.

16. The system of claim 15, wherein the processor is further configured to cause a display of a connectivity form at the graphical user interface, wherein the connectivity form allows for verification of the automatic connection.

17. The system of claim 16, wherein the connectivity form allows a user to override the automatic connection.

18. The system of claim 15, wherein the first group and the second group have a fluid definition wherein a structure or membership of the first and second groups changes throughout an electronic design cycle.

19. The system of claim 15, wherein upon a design change to a higher level or a lower level of a design hierarchy, the automatic connection assignment is preserved.

20. The system of claim 15, wherein the first group and the second group has a tree-like structure.

* * * * *